(12) United States Patent
Wang et al.

(10) Patent No.: US 11,742,387 B2
(45) Date of Patent: Aug. 29, 2023

(54) HYBRID CHANNEL SEMICONDUCTOR DEVICE AND METHOD

(71) Applicant: Taiwan Semiconductor Manufacturing Co., Ltd., Hsinchu (TW)

(72) Inventors: Pei-Yu Wang, Hsinchu (TW); Pei-Hsun Wang, Kaohsiung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/745,655

(22) Filed: May 16, 2022

(65) Prior Publication Data

US 2022/0278200 A1  Sep. 1, 2022

Related U.S. Application Data

(62) Division of application No. 16/787,306, filed on Feb. 11, 2020, now Pat. No. 11,335,776.

(51) Int. Cl.
 *H01L 29/10* (2006.01)
 *H01L 29/06* (2006.01)
 (Continued)

(52) U.S. Cl.
 CPC ...... *H01L 29/1037* (2013.01); *H01L 21/0262* (2013.01); *H01L 21/02532* (2013.01); *H01L 21/3065* (2013.01); *H01L 21/30604* (2013.01); *H01L 21/76224* (2013.01); *H01L 27/0886* (2013.01); *H01L 29/0649* (2013.01); *H01L 29/0673* (2013.01); *H01L 29/0847* (2013.01); *H01L 29/42392* (2013.01);
 (Continued)

(58) Field of Classification Search
 CPC ......... H01L 21/02532; H01L 21/30604; H01L 21/3065; H01L 21/823412; H01L 27/0886; H01L 29/0649; H01L 29/0673; H01L 29/0847; H01L 29/1037; H01L 29/42392; H01L 29/66636; H01L 29/66795; H01L 29/785
 See application file for complete search history.

(56) References Cited

U.S. PATENT DOCUMENTS

| 9,209,247 B2 | 1/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |

(Continued)

*Primary Examiner* — Dao H Nguyen
(74) *Attorney, Agent, or Firm* — Slater Matsil, LLP

(57) ABSTRACT

A device includes a first semiconductor strip protruding from a substrate, a second semiconductor strip protruding from the substrate, an isolation material surrounding the first semiconductor strip and the second semiconductor strip, a nanosheet structure over the first semiconductor strip, wherein the nanosheet structure is separated from the first semiconductor strip by a first gate structure including a gate electrode material, wherein the first gate structure partially surrounds the nanosheet structure, and a first semiconductor channel region and a semiconductor second channel region over the second semiconductor strip, wherein the first semiconductor channel region is separated from the second semiconductor channel region by a second gate structure including the gate electrode material, wherein the second gate structure extends on a top surface of the second semiconductor strip.

20 Claims, 24 Drawing Sheets

(51) Int. Cl.
*H01L 29/08* (2006.01)
*H01L 29/423* (2006.01)
*H01L 21/02* (2006.01)
*H01L 29/66* (2006.01)
*H01L 21/3065* (2006.01)
*H01L 21/762* (2006.01)
*H01L 21/306* (2006.01)
*H01L 29/78* (2006.01)
*H01L 27/088* (2006.01)
*H01L 21/3105* (2006.01)

(52) U.S. Cl.
CPC .... *H01L 29/6656* (2013.01); *H01L 29/66545* (2013.01); *H01L 29/66636* (2013.01); *H01L 29/66795* (2013.01); *H01L 29/785* (2013.01); *H01L 21/31053* (2013.01)

(56) References Cited

U.S. PATENT DOCUMENTS

| | | | |
|---|---|---|---|
| 9,502,265 | B1 | 11/2016 | Jiang et al. |
| 9,520,482 | B1 | 12/2016 | Chang et al. |
| 9,536,738 | B2 * | 1/2017 | Huang ................ H01L 27/092 |
| 9,576,814 | B2 | 2/2017 | Wu et al. |
| 9,608,116 | B2 | 3/2017 | Ching et al. |
| 10,276,380 | B2 * | 4/2019 | Wen .................... H01L 21/3086 |
| 10,332,803 | B1 | 6/2019 | Xie et al. |
| 10,439,039 | B2 | 10/2019 | Song et al. |
| 2016/0307767 | A1 * | 10/2016 | Lee ....................... H01L 21/845 |
| 2017/0133459 | A1 * | 5/2017 | Pranatharthiharan ...................... H01L 29/66795 |
| 2018/0053651 | A1 * | 2/2018 | Leobandung ..... H01L 21/76224 |
| 2018/0233517 | A1 * | 8/2018 | Cheng .................. H01L 21/845 |
| 2019/0148520 | A1 * | 5/2019 | Chang ................ H01L 21/3086 257/192 |

* cited by examiner

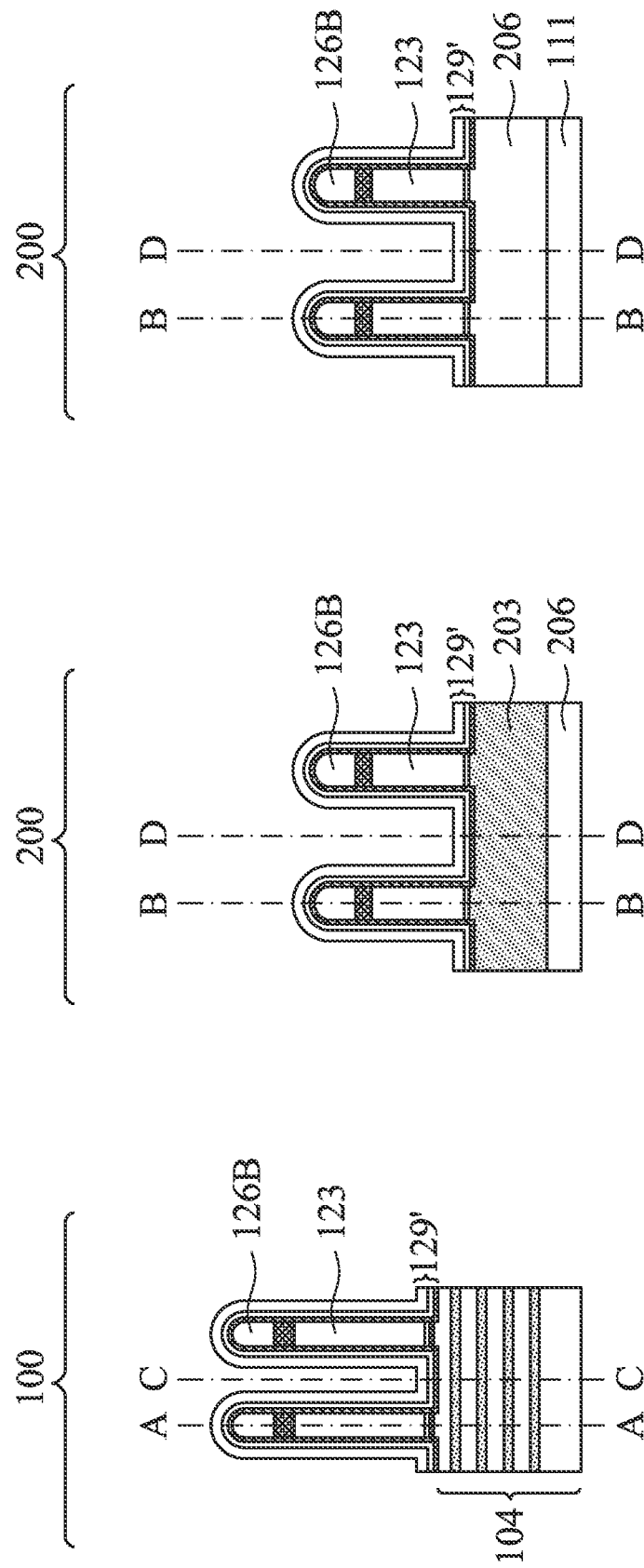

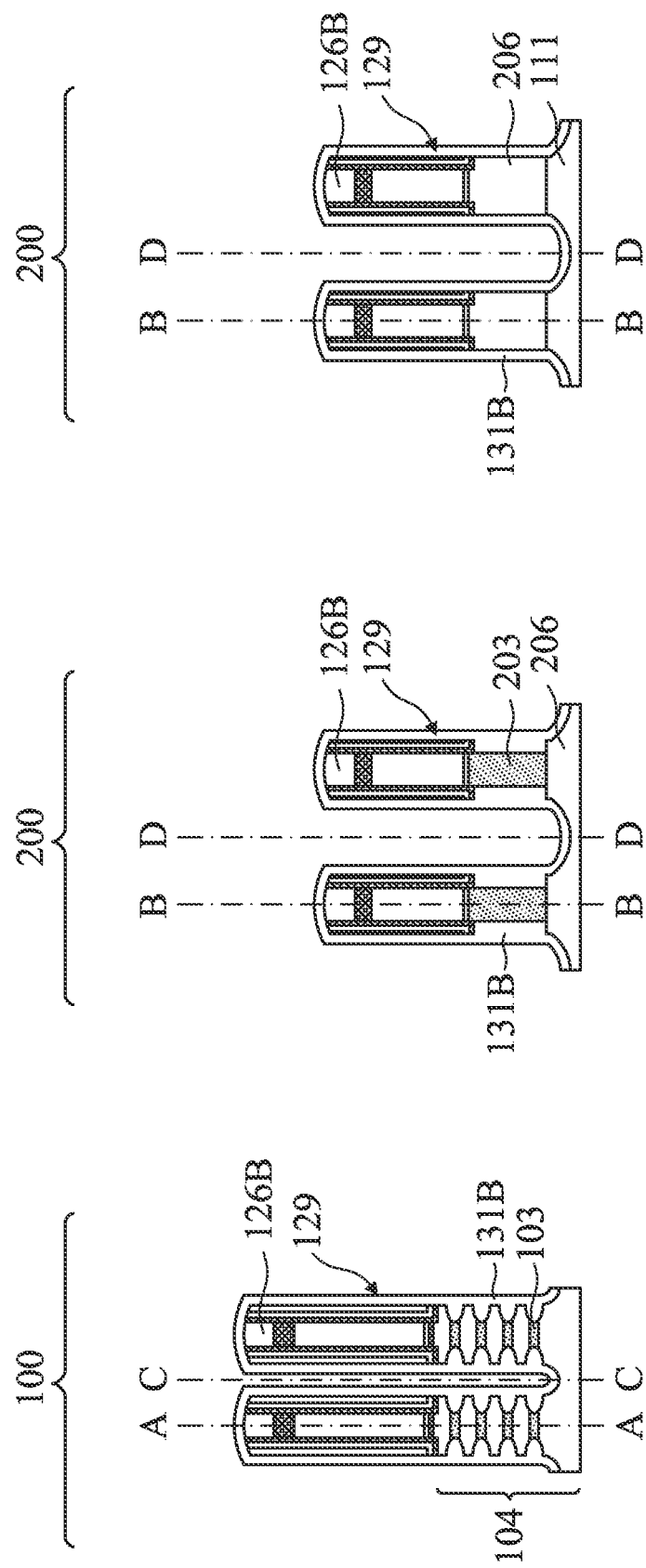

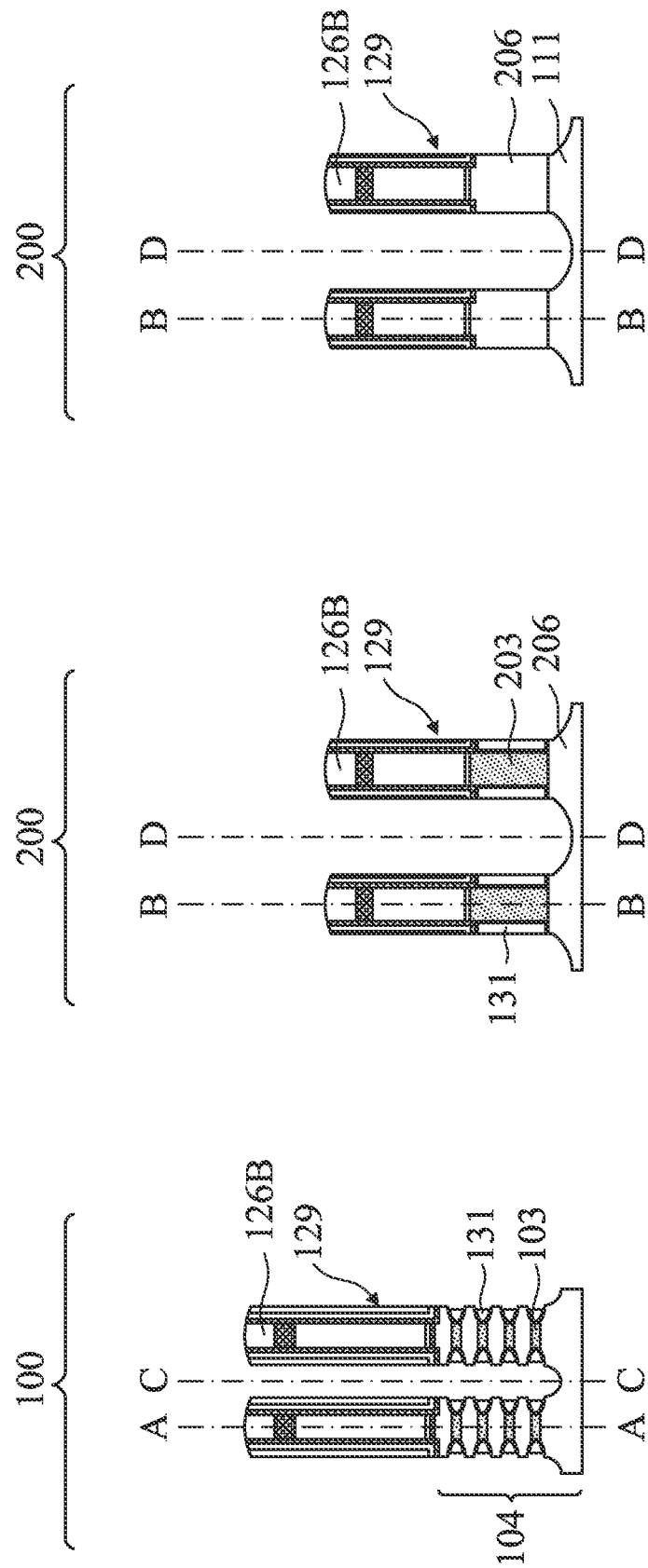

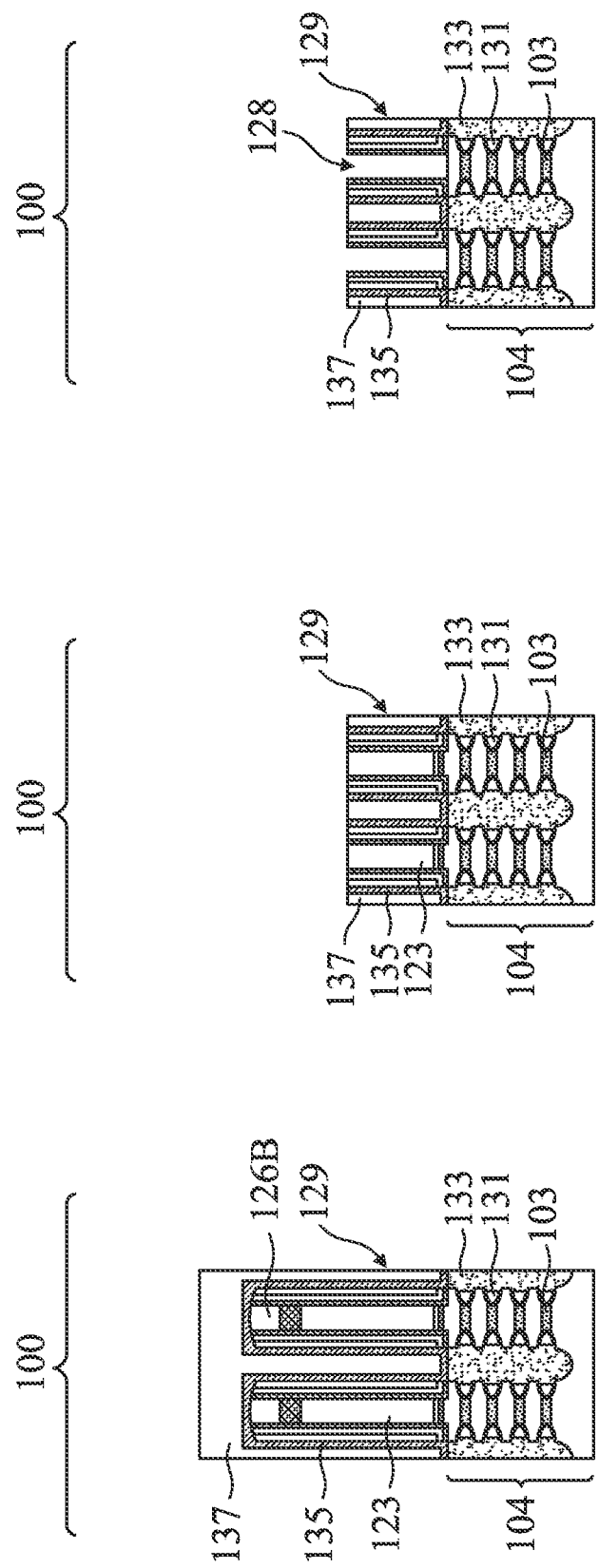

HYBRID CHANNEL SEMICONDUCTOR DEVICE AND METHOD

PRIORITY CLAIM AND CROSS-REFERENCE

This application is a divisional of U.S. patent application Ser. No. 16/787,306, filed on Feb. 11, 2020, which application is hereby incorporated herein by reference in its entirety.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching techniques to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 4, 5A-5B, 6A-6B, 7A-7B, 8A-8G, 9A-9G, 10A-10B, 11A-11G, 12A-12G, and 13A-13G illustrate cross-sectional views of intermediate stages in the formation of a hybrid channel device comprising gate-all-around (GAA) field-effect transistor (FET) devices and double-channel fin field-effect transistors (FinFETs), in accordance with some embodiments.

FIGS. 14A through 14E illustrate cross-sectional views of intermediate stages in the formation of GAA FET devices in a hybrid channel device, in accordance with some embodiments.

DETAILED DESCRIPTION

Figure 1:
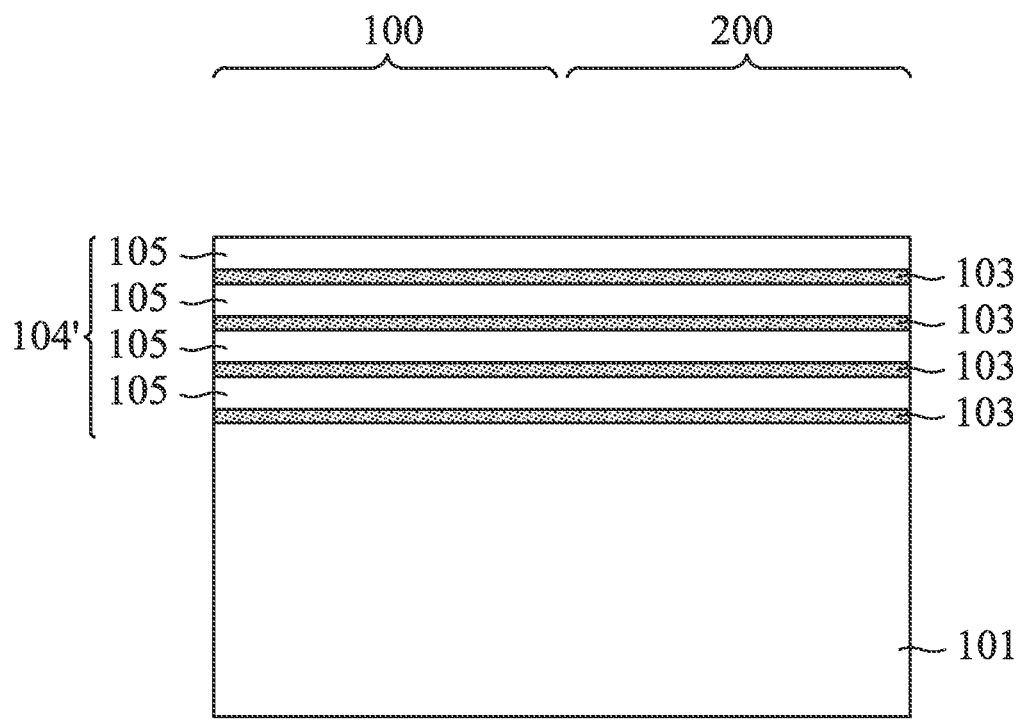

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. Unless other specified, the same or similar reference numerals in different figures refer to the same or similar component formed by a same or similar process(es) using a same or similar material(s).

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a semiconductor device includes gate-all-around (GAA) field-effect transistors (FETs) formed in a first region and FinFETs formed in a second region. The FinFETs each include two channel regions ("double channel regions"). Forming multiple channels for each FinFET can allow for increased operating current. The double channel regions are formed by forming mandrels from silicon germanium and then epitaxially growing the semiconductor material of the channel regions on sidewalls of the mandrels. The use of silicon germanium for forming the mandrels allows for improved process uniformity and reduced defects.

FIGS. 1 through 15D illustrate cross-sectional views of intermediate stages in the formation of a hybrid channel device comprising gate-all-around (GAA) field-effect transistor (FET) devices 100 and FinFETs 200, in accordance with some embodiments. The GAA FETs 100 and the FinFETs 200 may be formed in different regions of the same structure. In FIGS. 1 through 15D, regions in which GAA FETs 100 are formed are labeled as "100" and regions in which FinFETs 200 are formed are labeled as "200." For clarity, a region 100 and a region 200 may be shown in separate Figures, but it should be appreciated that the regions 100 and regions 200 as described herein may be regions of the same structure.

Referring to FIG. 1, a substrate 101 is provided. The substrate 101 may be a semiconductor substrate, such as a bulk semiconductor (e.g., bulk silicon), a semiconductor-on-insulator (SOI) substrate, or the like, which may be doped (e.g., with a P-type or an N-type dopant) or undoped. The substrate 101 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 101 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In FIG. 1, an epitaxial material stack 104' is formed over the substrate 101, in accordance with some embodiments. The epitaxial material stack 104' includes alternating first semiconductor layers 103 and second semiconductor layers 105. The first semiconductor layers 103 are formed of a first semiconductor material, and the second semiconductor layers 105 are formed of a different second semiconductor material. In the illustrated embodiment, the first semiconductor material is silicon germanium ($Si_xGe_{1-x}$, where x can be in the range of 0 to 1). In some embodiments, the first semiconductor material is silicon germanium comprising between about 20% germanium (e.g., x is about 0.8) and about 45% germanium (e.g., x is about 0.55). In the illustrated embodiment, the second semiconductor material is silicon. Other semiconductor materials or combinations of semiconductor materials are possible. In some embodiments, the first semiconductor layers 103 have a thickness between about 4 nm and about 10 nm. In some embodiments, the second semiconductor layers 105 have a thickness between about 6 nm and about 15 nm. Other thicknesses are possible. The epitaxial material stack 104' may include any number of layers. The topmost layer of the epitaxial material stack 104' may comprise the first semiconductor material, the second semiconductor material, or another material. In subsequent processing, the epitaxial material stacks 104' will be patterned to form channel regions of GAA FETs 100. In particular, the epitaxial material stack 104' is subsequently patterned to form nanostructures (e.g., nanowires, nanosheets, or the like), with the channel regions of the resulting GAA FETs 100 including multiple nanostructures.

The epitaxial material stack 104' may be formed by an epitaxial growth process, which may be performed in a growth chamber. During the epitaxial growth process, the growth chamber is cyclically exposed to a first set of precursors for growing the first semiconductor layers 103, and then exposed to a second set of precursors for growing the second semiconductor layers 105. The first set of precursors includes precursors for the first semiconductor material (e.g., silicon germanium), and the second set of precursors includes precursors for the second semiconductor material (e.g., silicon). The epitaxial material stack 104' may be doped or undoped, depending on the design of the GAA FETs 100. In some embodiments, the epitaxial material stack 104' is formed having a total thickness that is between about 40 nm and about 70 nm.

In some embodiments, the first set of precursors includes a silicon precursor (e.g., silane) and a germanium precursor (e.g., a germane), and the second set of precursors includes the silicon precursor but omits the germanium precursor. The epitaxial growth process may thus include continuously enabling a flow of the silicon precursor to the growth chamber, and then cyclically: (1) enabling a flow of the germanium precursor to the growth chamber when growing a first semiconductor layer 103; and (2) disabling the flow of the germanium precursor to the growth chamber when growing a second semiconductor layer 105. The cyclical exposure may be repeated until a target number of layers are formed. After the growth cycles are finished, a planarization process may be performed to level the top surface of the epitaxial material stack 104'. The planarization process may include a chemical mechanical polish (CMP), a grinding process, an etch back process, combinations thereof, or the like.

Figure 2:
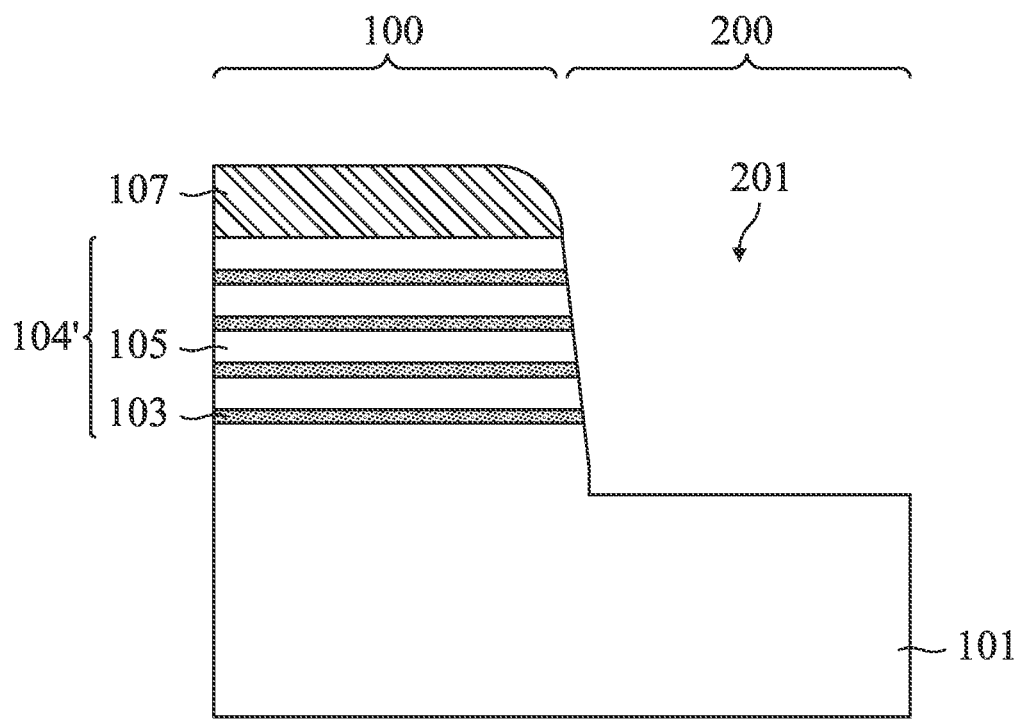

Referring next to FIG. 2, the epitaxial material stack 104' in the region 200 is etched to form a recess 201. In some embodiments, a hard mask layer 107 is formed over the epitaxial material stack 104' and patterned to expose the epitaxial material stack 104' in the region 200. The hard mask layer 107 may include sublayers, such as a pad oxide layer and an optional overlying pad nitride layer. The pad oxide layer may be a thin film comprising silicon oxide formed, for example, using a thermal oxidation process. The pad oxide layer may act as an adhesion layer between the epitaxial material stack 104' and the overlying pad nitride layer. In some embodiments, the pad nitride layer is formed of silicon nitride, silicon oxynitride, silicon carbonitride, the like, or a combination thereof, and may be formed using low-pressure chemical vapor deposition (LPCVD) or plasma enhanced chemical vapor deposition (PECVD), as examples. In some embodiments, the hard mask layer 107 is formed having a thickness between about 10 nm and about 30 nm, though other thicknesses are possible.

The hard mask layer 107 may be patterned using, e.g., photolithography and etching techniques. The patterned hard mask layer 107 is then used as an etching mask for an etching process to pattern the substrate 101 and/or the epitaxial material stack 104', forming the recess 201 in the region 200. The patterned hard mask layer 107 protects the epitaxial material stack 104' in the region 100 during the etching process. The etching process may include one or more suitable dry etching processes and/or wet etching processes. In some embodiments, the etching process includes a timed etch. In some embodiments, the recess 201 may extend a depth between about 50 nm and about 100 nm from the top of the epitaxial material stack 104'. The recess 201 may extend into the substrate 101.

Figure 3:
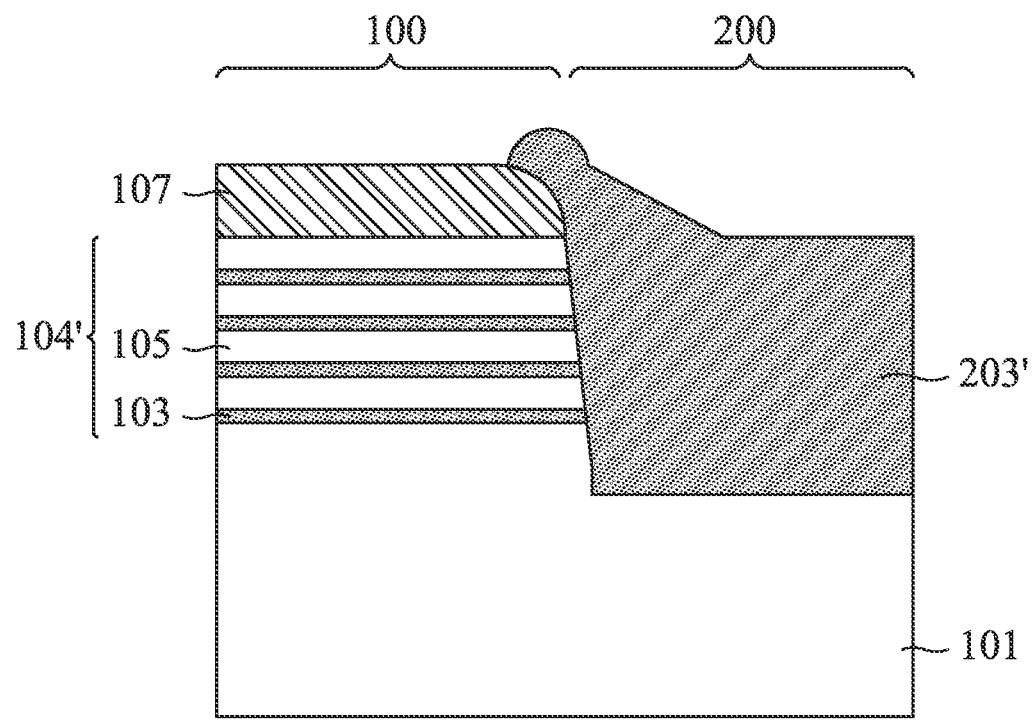

In FIG. 3, a mandrel material 203' is formed within the recess 201, in accordance with some embodiments. The mandrel material 203' may be formed to fill the recess 201. For example, the mandrel material 203' may be formed having a thickness that is about the same or greater than the depth of the recess 201. Portions of the mandrel material 203' may extend over the hard mask 107, as shown in FIG. 3. The mandrel material 203' may be formed by an epitaxial growth process, which may be performed in a growth chamber. During the epitaxial growth process, the growth chamber exposed to a set of precursors (e.g., silane and germane) for growing the mandrel material 203'. In the some embodiments, the mandrel material 203' is silicon germanium ($Si_xGe_{1-x}$, where x can be in the range of 0 to 1). In some embodiments, the mandrel material 203' is silicon germanium comprising between about 20% germanium (e.g., x is about 0.8) and about 45% germanium (e.g., x is about 0.55). The mandrel material 203' may be formed using techniques or a set of precursors similar to that of the first semiconductor material of the first semiconductor layers 103. For example, in some embodiments, the first semiconductor layers 103 and the mandrel material 203' may both be silicon germanium having the same or different compositions (e.g., the same value of x or different values of x). The mandrel material 203' may be doped or undoped.

The material of the hard mask layer 107 and/or the material of the mandrel material 203' may be chosen such that the mandrel material 203' selectively grows on surfaces of the recess 201 over surfaces of the hard mask layer 107. For example, the hard mask layer 107 may be formed from silicon nitride or silicon carbonitride and the mandrel material 203' may be formed from silicon germanium to suppress epitaxial growth of the mandrel material 203' on the hard mask layer 107. In some cases, the use of silicon germanium for the mandrel material 203' has a more selective epitaxial growth of the mandrel material 203' than the use of other materials, such as silicon. In this manner, the use of silicon germanium for the mandrel material may suppress growth of the mandrel material 203' on the hard mask layer 107 more than other materials that may be used for the mandrel material 203', such as silicon. The use of silicon germanium for the mandrel material 203' in this manner may allow the mandrel material 203' to be formed having fewer defects than the use of other materials (e.g., silicon). Forming the mandrel material 203' from silicon germanium reduces growth of the mandrel material 203' on the hard mask layer 107, which may allow for thicker epitaxial growth of the mandrel material 203' and improved filling of the recess 201 by the mandrel material 203'.

Figure 4:
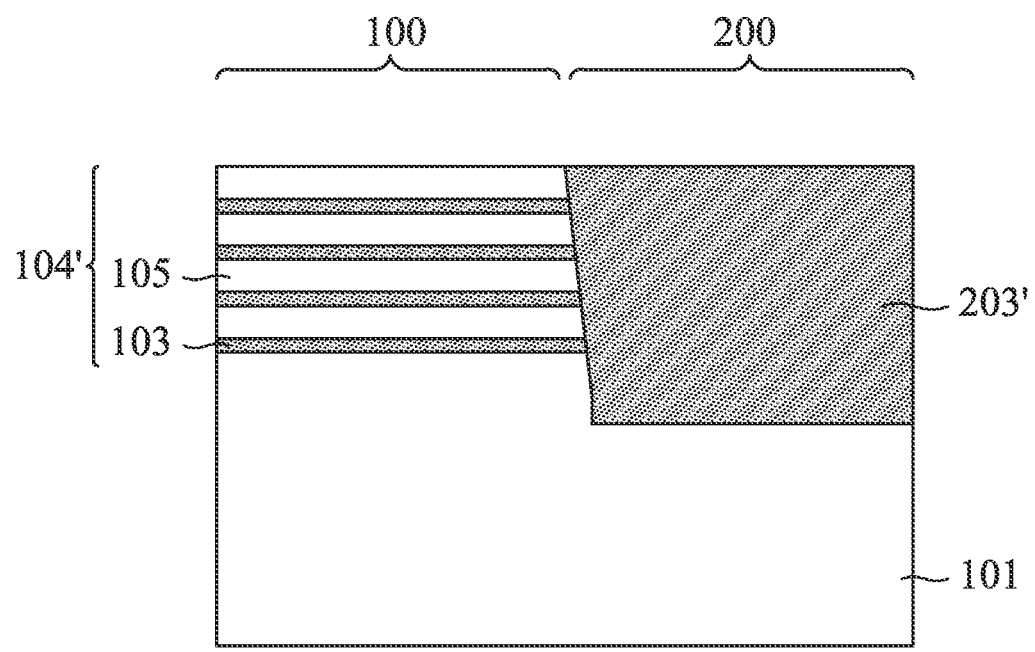

In FIG. 4, a planarization process (e.g., a CMP process or the like) is performed to remove the hard mask layer 107 and excess mandrel material 203, in accordance with some embodiments. After the planarization process, the top surfaces of the epitaxial material stack 104' and the mandrel material 203' may be coplanar. In some embodiments, the hard mask layer 107 may be removed using an etching process, such as a dry etching process or a wet etching process.

Figure 5B:
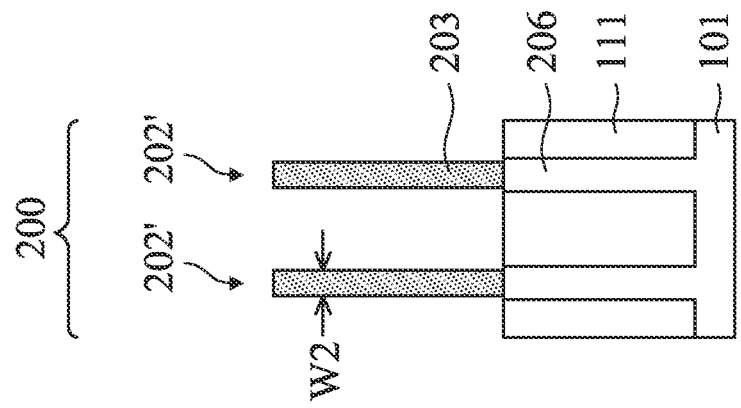
Figure 5A:
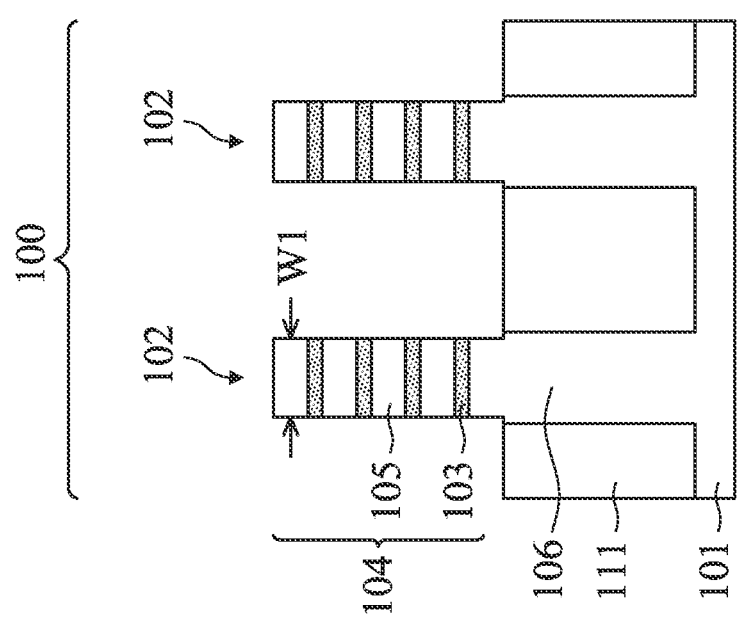

In FIGS. 5A-B, the region 100 is patterned to form semiconductor fins 102 and the region 200 is patterned to form mandrel structures 202', in accordance with some embodiments. FIG. 5A shows a portion of the region 100, which may be a portion of the region 100 shown in FIGS. 1-4, and FIG. 5B shows a portion of the region 200, which may be a portion of the region 200 shown in FIGS. 1-4. In other words, the region 100 shown in FIG. 5A and the region 200 shown in FIG. 5B may be formed on the same substrate 101.

To form the semiconductor fins 102 in region 100, the epitaxial material stack 104' and the substrate 101 may be patterned using photolithography and etching techniques. For example, a hard mask (not shown) may be formed over the epitaxial material stack 104' in region 100 and a photoresist material formed over the hard mask. The photoresist material may be patterned using suitable photolithography techniques, and then the patterned photoresist material is used to pattern the hard mask. The patterned hard mask is subsequently used to pattern the substrate 101 and the epitaxial material stack 104' to form trenches, thereby defining semiconductor fins 102 between adjacent trenches. In the illustrated embodiment, each of the semiconductor fins 102 includes a semiconductor strip 106 and a patterned epitaxial material stack 104 over the semiconductor strip 106. The semiconductor strip 106 is a patterned portion of the substrate 101 and protrudes above the (recessed) substrate 101. The patterned epitaxial material stack 104 is a patterned portion of the epitaxial material stack 104' and is used to form nanostructures in subsequent processing, and therefore, may also be referred to as GAA structures 104. The hard mask and photoresist material may be removed from the semiconductor fins 102, as shown in FIG. 5A. In some embodiments, the fins 102 may be formed having a width W1 that is between about 10 nm and about 100 nm. The semiconductor fins 102 may also be referred to as fins 102 hereinafter.

To form the mandrel structures 202' in region 200, the mandrel material 203' and the substrate 101 may be patterned using photolithography and etching techniques. For example, a hard mask (not shown) may be formed over the mandrel material 203' in region 200 and a photoresist material formed over the hard mask. The hard mask may be formed along with the hard mask described above that is used for forming the semiconductor fins 102. The photoresist material may be patterned using suitable photolithography techniques, and then the patterned photoresist material is used to pattern the hard mask. The patterned hard mask is subsequently used to pattern the substrate 101 and the mandrel material 203' to form trenches, thereby defining mandrel structures 202' between adjacent trenches. In the illustrated embodiment, each of the mandrel structures 202' includes a semiconductor strip 206 and a mandrel 203 over the semiconductor strip 206. The semiconductor strip 206 is a patterned portion of the substrate 101 and protrudes above the (recessed) substrate 101. The mandrels 203 are formed from the patterned mandrel material 203' and are used to form channel regions 207 of the FinFETs 200 in subsequent processing. The mandrels 203 are removed in subsequent steps, and may thus be considered dummy structures or sacrificial structures. In some embodiments, the mandrels 203 may be formed having a width W2 that is between about 5 nm and about 10 nm. In some embodiments, the mandrels 203 may be formed having a pitch that is between about 25 nm and about 50 nm.

In some embodiments, the fins 102 and the mandrels structures 202' are formed using some or all of the same photolithography or etching steps. For example, the hard mask used to form the mandrel structures 202' may be formed and/or patterned in the same steps as the hard mask described above for forming the fins 102. In some embodiments, the fins 102 and the mandrel structures 202' are formed using different photolithography steps, and one of the fins 102 or the mandrel structures 202' is formed before the other. The fins 102 and/or the mandrel structures 202' may be patterned by any suitable method. For example, the fins 102 and/or the mandrel structures 202' may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 102 and/or mandrels 203.

FIGS. 5A-B also illustrate the formation of an insulation material in the region 100 and the region 200 to form isolation regions 111. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials and/or other formation processes may be used. In the illustrated embodiment, the insulation material is silicon oxide formed by a FCVD process. An anneal process may be performed once the insulation material is formed. A planarization process, such as CMP, may remove any excess insulation material from over the top surfaces of the semiconductor fins 102 or the mandrel structures 202'.

Next, the isolation regions are recessed to form shallow trench isolation (STI) regions 111. The isolation regions 111 are recessed such that the upper portions of the semiconductor fins 102 and the mandrel structures 202' protrude from between neighboring STI regions 111. The top surfaces of the STI regions 111 may have a flat surface (as illustrated), a convex surface, a concave surface (such as dishing), or a combination thereof. The top surfaces of the STI regions 111 may be formed flat, convex, and/or concave by an appropriate etch. The isolation regions 111 may be recessed using an acceptable etching process, such as one that is selective to the material of the isolation regions 111.

For example, a dry etch, or a wet etch using dilute hydrofluoric (dHF) acid, may be performed to recess the isolation regions 111. In FIGS. 5A-B, the upper surface of the STI regions 111 is illustrated to be level with upper surfaces of the semiconductor strips 106 and 206. In other embodiments, the upper surface of the STI regions 111 is lower (e.g., closer to the substrate 101) than the upper surfaces of the semiconductor strips 106 or 206. In some embodiments, the fins 102 extend above the STI regions 111 a distance between about 40 nm and about 70 nm. In some embodiments, the mandrels 203 extend above the STI regions 111 a distance between about 40 nm and about 70 nm.

Figure 6B:
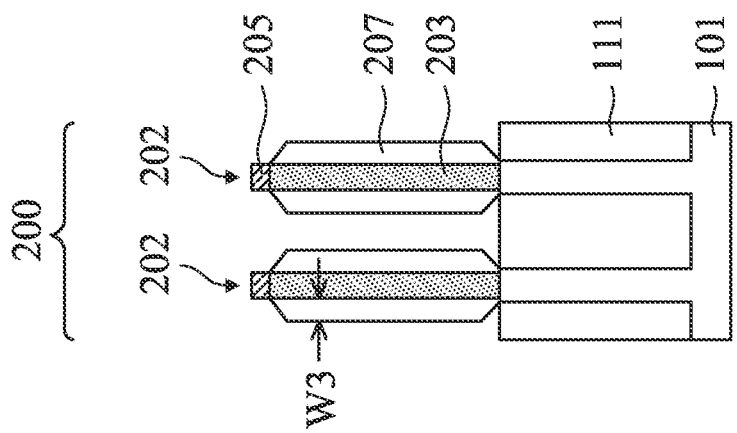
Figure 6A:
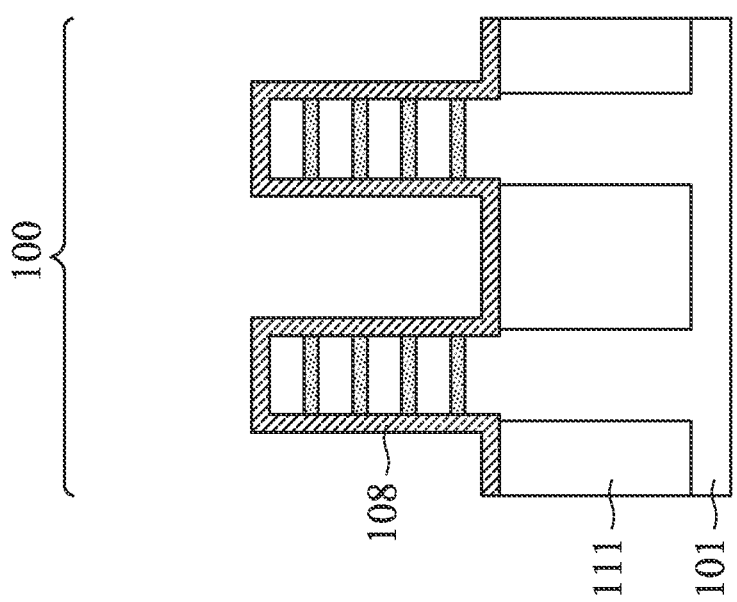
Figure 7B:
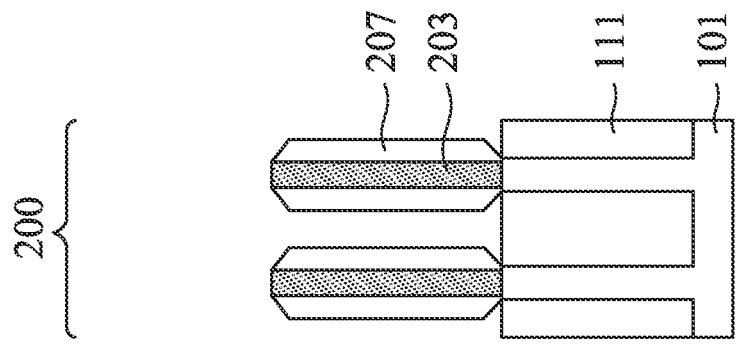
Figure 7A:
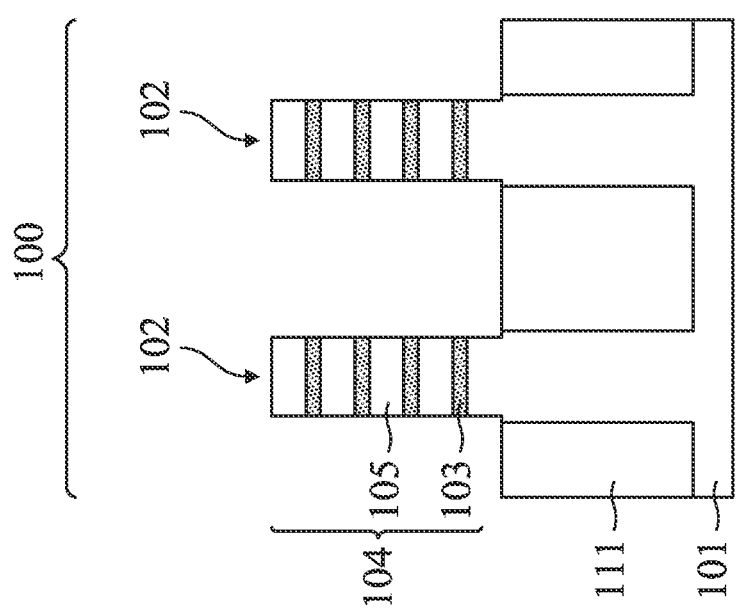

In FIGS. 6A-B, channel regions 207 are epitaxially grown on the mandrels 203, in accordance with some embodiments. Prior to formation of the channel regions 207, a hard mask layer 108 may be formed over the region 100 and over region 200. The hard mask layer 108 may be patterned using suitable photolithography and etching techniques to remove the material of the hard mask layer 108 from the sidewalls of the mandrels 203. As shown in FIG. 6B, after patterning, portions of the hard mask layer 108 may be left remaining over the mandrel structures 202' to protect the mandrels 203 and to block epitaxial growth of the material of the channel regions 207 on top surfaces of the mandrels 203. The hard mask layer 108 may comprise a dielectric material such as silicon nitride or the like, and may be formed using a suitable deposition method such as CVD or the like. The hard mask layer 108 may be formed having a thickness between about 3 nm and about 5 nm.

After forming the hard mask layer 108 over the region 100, the channel regions 207 are epitaxially grown on the mandrels 203, forming channel structures 202. Each channel structure 202 includes a semiconductor strip 206, a mandrel 203 over the semiconductor strip 206, and two channel regions 207, in which one channel region 207 is on each sidewall of the mandrel 203. The channel regions 207 are used as the channel regions of the FinFETs 200. By forming the channel regions 207 in this manner, two channel regions 207 may be formed for each semiconductor strip 206 instead of only one, thus increasing the number of channel regions formed for a FinFET device such as an I/O device with FinFETs. By increasing the number of channel regions in this manner, the current of the FinFET device may be increased. For example, since two channel regions are formed instead of one, the maximum current of the FinFET device may be approximately doubled. By increasing the operational current, the performance of a FinFET device may be improved.

The channel regions 207 are formed from a semiconductor material that may be epitaxially grown on the exposed material of the mandrels 203. For example, in some embodiments, the channel regions 207 comprise silicon that is epitaxially grown on mandrels 203 comprising silicon germanium. The channel regions 207 may be doped or undoped. The channel regions 207 may be formed by an epitaxial growth process, which may be performed in a growth chamber. During the epitaxial growth process, the growth chamber is exposed to one or more precursors (e.g., silane) for growing the channel regions 207. The epitaxial growth process may include continuously enabling a flow of the precursor to the growth chamber. In some embodiments, the channel regions 207 may be formed having a thickness W3 that is between about 5 nm and about 10 nm. In some cases, the available thickness W3 of the channel regions 207 may be determined by the separation distance (e.g., the pitch) between the mandrel structures 202'. In some cases, epitaxially growing the channel regions 207 to have a relatively smaller thickness W3 may reduce the amount of defects formed within the channel regions 207. After forming the channel regions 207, the hard mask layer 108 is removed, forming the structures shown in FIGS. 7A-B. The hard mask layer 108 may be removed using, e.g., one or more suitable dry or wet etching processes.

Figure 8B:
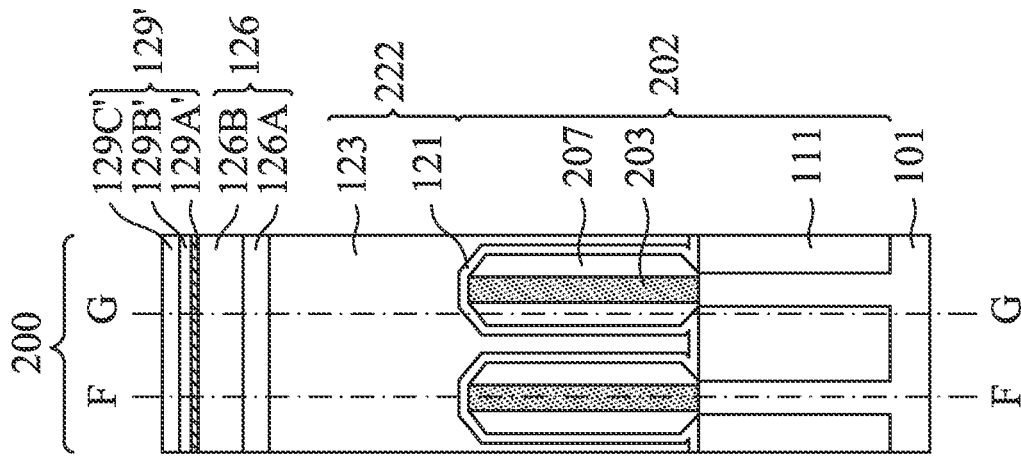
Figure 8A:
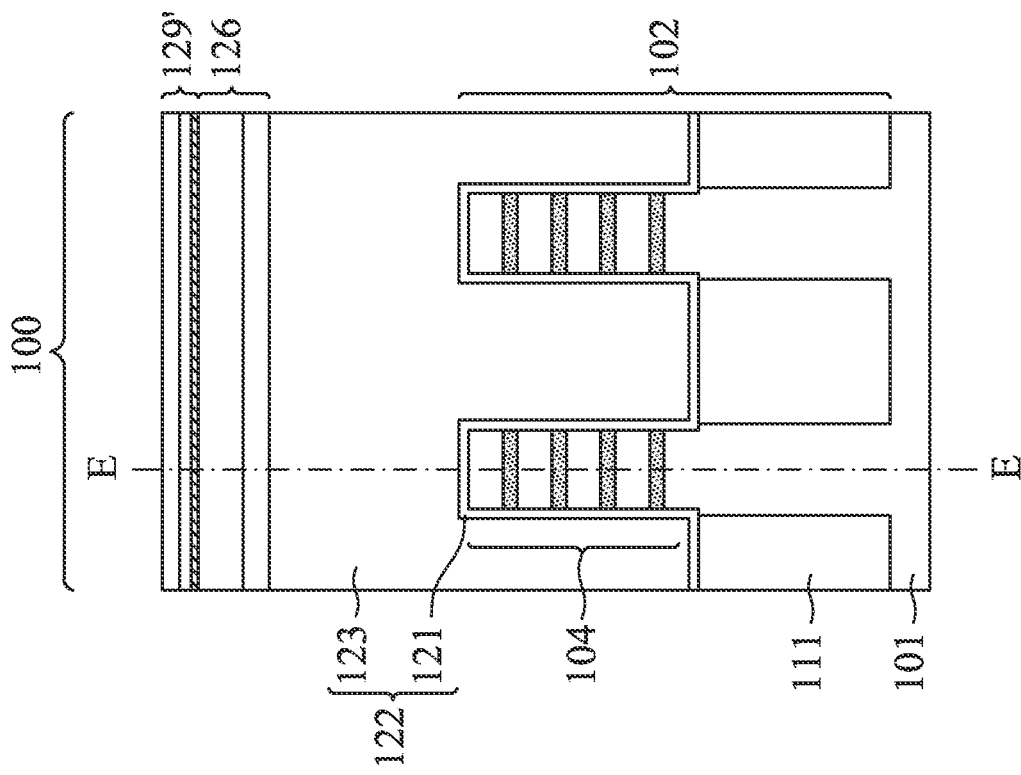
Figure 8D:
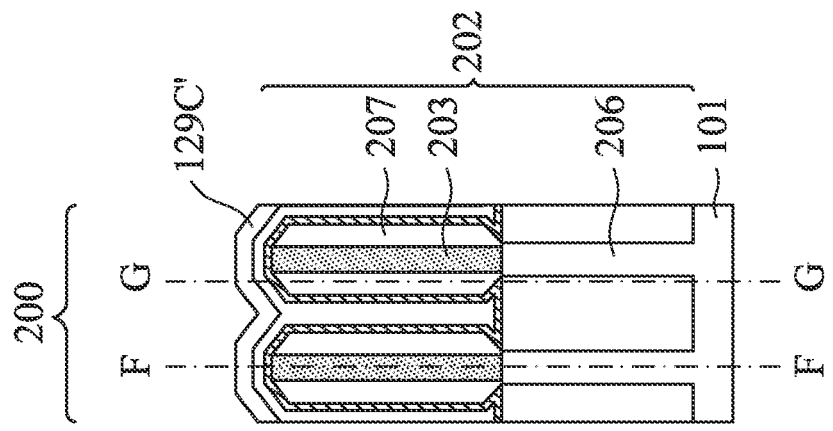
Figure 8C:
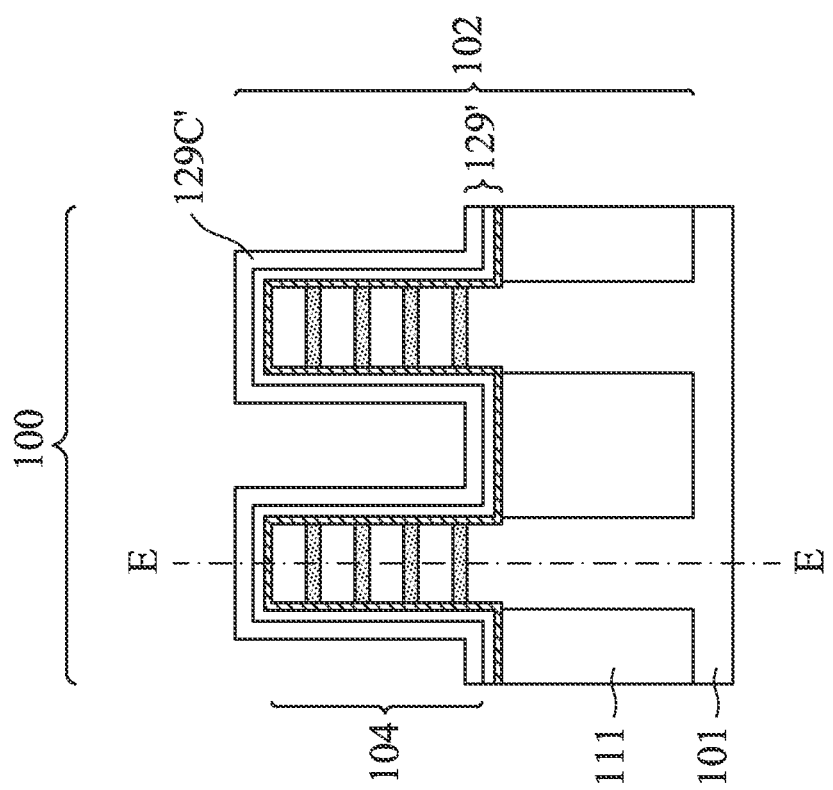

In FIGS. 8A-G, dummy gate structures 122 are formed over the fins 102 and dummy gate structures 222 are formed over the channel structures 202. FIGS. 8A, 8C, and 8E show various cross-sectional views of the structure in the region 100, and FIGS. 8B, 8D, 8F, and 8G show various cross-sectional views of the structure in the region 200. FIGS. 8A and 8C illustrate cross-sectional views of the region 100 parallel to the dummy gate structures 122, and FIGS. 8B and 8D illustrate cross-sectional views of the region 200 parallel to the dummy gate structures 222. FIG. 8E illustrates a cross-sectional view of the region 100 that is perpendicular to the view of the region 100 shown in FIGS. 8A and 8C, and FIGS. 8F and 8G illustrate cross-sectional views of the region 200 that are perpendicular to the view of the region 200 shown in FIGS. 8B and 8D. The cross-sectional view of each of FIGS. 8A-G is correspondingly labeled in other Figures. For example, FIG. 8E is a cross-sectional view of the cross-section "E-E" shown in FIGS. 8A and 8C. Other Figures have similarly labeled cross-sections.

Still referring to FIGS. 8A-G, dummy gate structures 122 are formed over the semiconductor fins 102 and dummy gate structures 222 are formed over the channel structures 202. Each of the dummy gate structures 122/222 includes a gate dielectric 121 and a gate electrode 123, in some embodiments. The dummy gate structures 122/222 may be formed using some or all of the same processing steps. To form the dummy gate structures 122/222, the gate dielectric 121 is formed by depositing a dielectric layer over the structures in the regions 100/200. The dielectric layer may be, for example, silicon oxide, silicon nitride, multilayers thereof, or the like, and may be deposited or thermally grown. Next, a gate electrode layer is formed over the gate dielectric 121 to form the gate electrode 123. The gate electrode layer may comprise, for example, polysilicon, although other materials may also be used. The gate electrode layer may be deposited over the dielectric layer and then planarized, such as by a CMP process.

A mask layer may then be deposited over the gate electrode layer. The mask layer may be formed of, for example, silicon oxide, silicon nitride, combinations thereof, or the like. The mask layer may be patterned using acceptable photolithography and etching techniques to form the mask 126, shown in FIGS. 8A-G. In some embodiments, the mask 126 includes a first mask 126A (e.g., silicon oxide or the like) and a second mask 126B (e.g., silicon nitride, silicon carbonitride, or the like). The pattern of the mask 126 may then transferred to the gate electrode layer and the dielectric layer by acceptable etching techniques to form the gate dielectric 121 and the gate electrode 123. The gate electrode 123 may have a lengthwise direction substantially perpendicular to the lengthwise direction of the semiconductor fins 102 or the channel structures 202.

Still referring to FIGS. 8A-G, gate spacer layers 129' are formed over the gate electrode 123 and the gate dielectric 121 in the regions 100/200. The gate spacer layers 129' may conformally deposited. The gate spacer layers 129' may comprise one or more layers of silicon nitride, silicon carbonitride, silicon oxycarbide, silicon oxycarbonitride, a combination thereof, or the like. In some embodiments, the gate spacer layers 129' include multiple sublayers, shown as layers 129A', 129B', and 129C'. More or fewer sublayers are possible. For example, a first sublayer 129A' (sometimes referred to as a gate seal spacer layer) may be formed by thermal oxidation or a deposition, and a second sublayer 129B' (sometimes referred to as a main gate spacer layer) may be conformally deposited on the first sublayer. In some embodiments, the gate spacer layers 129' may be formed using CVD, PVD, ALD, the like, or a combination thereof.

Turning to FIGS. 9A-G, the gate spacer layers 129' are etched to form gate spacers 129, and portions of the GAA structures 104 and the channel structures 202 are removed in regions where source/drain regions 133 (see FIGS. 13A-G) are subsequently formed. The cross-sectional views shown in FIGS. 9A-G are the same as the respective cross-sectional views shown in FIGS. 8A-G. The gate spacers 129 are formed by anisotropically etching the gate spacer layers 129'. The anisotropic etching may remove horizontal portions of the gate spacer layers 129', with remaining vertical portions of the gate spacer layers 129' (e.g., along sidewalls of the gate electrode 123 and sidewalls of the gate dielectric 121) forming the gate spacers 129. In the discussion herein, the gate spacers 129 may also be referred to as part of the dummy gate structures 122/222.

Next, an anisotropic etching process is performed to remove portions of the GAA structures 104 (e.g., the first semiconductor layers 103 and the second semiconductor layers 105) and portions of the channel structures 202. The anisotropic etching process may be performed using the dummy gate structures 122/222 as an etching mask. In some embodiments, the anisotropic etching process includes one or more dry etch processes. The etching process exposes the underlying semiconductor strips 106/206 in the regions 100/200 and may form recesses in the semiconductor strips 106/206. Source/drain regions 133 are subsequently formed on the exposed regions of the semiconductor strips 106/206.

Figure 9B:
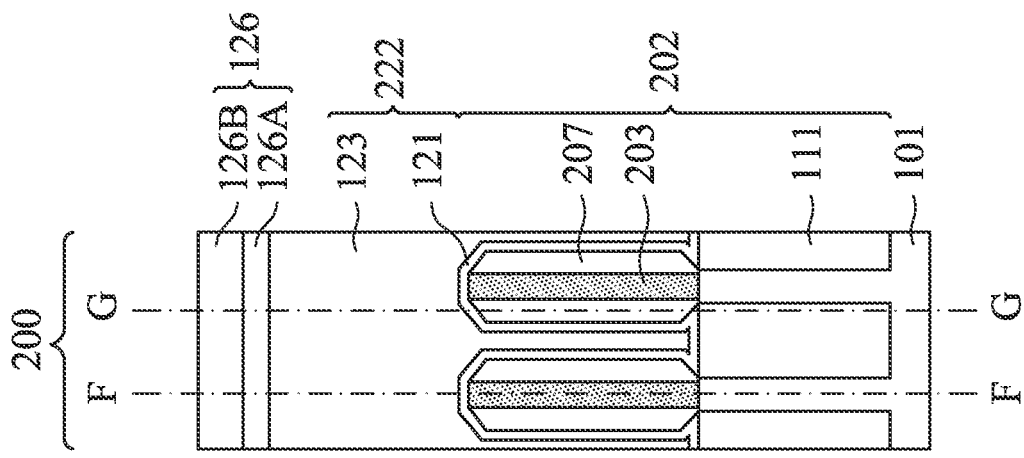
Figure 9A:
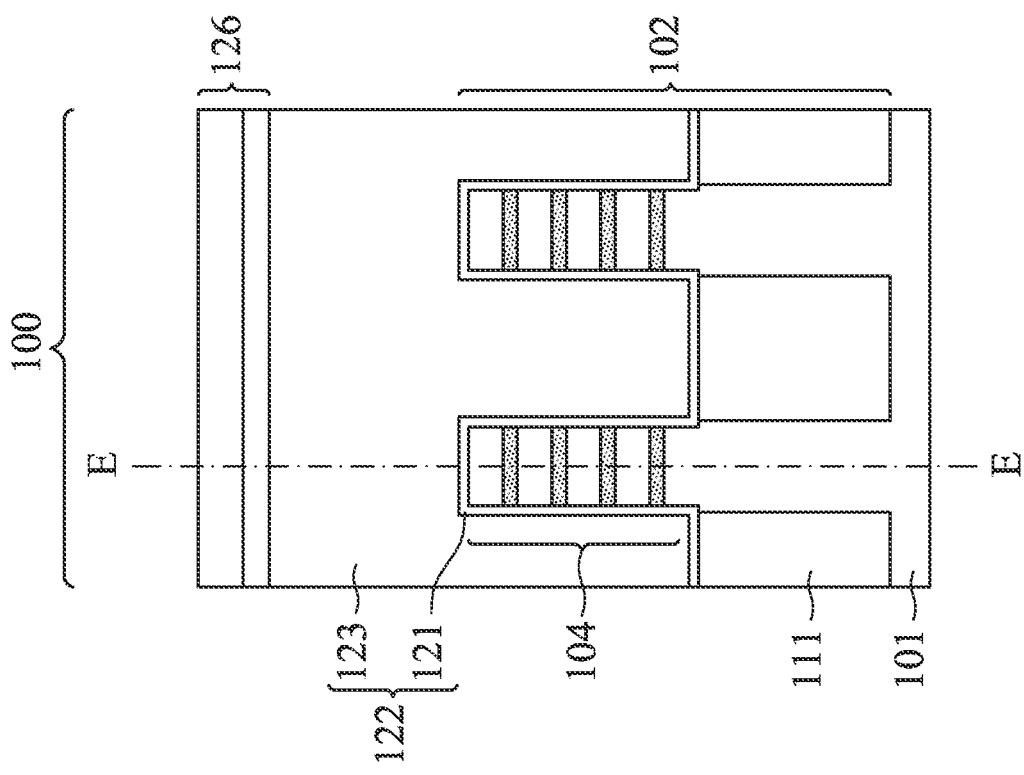
Figure 9D:
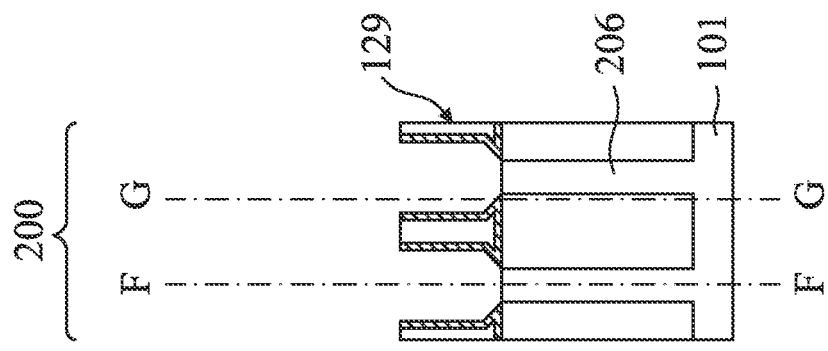
Figure 9C:
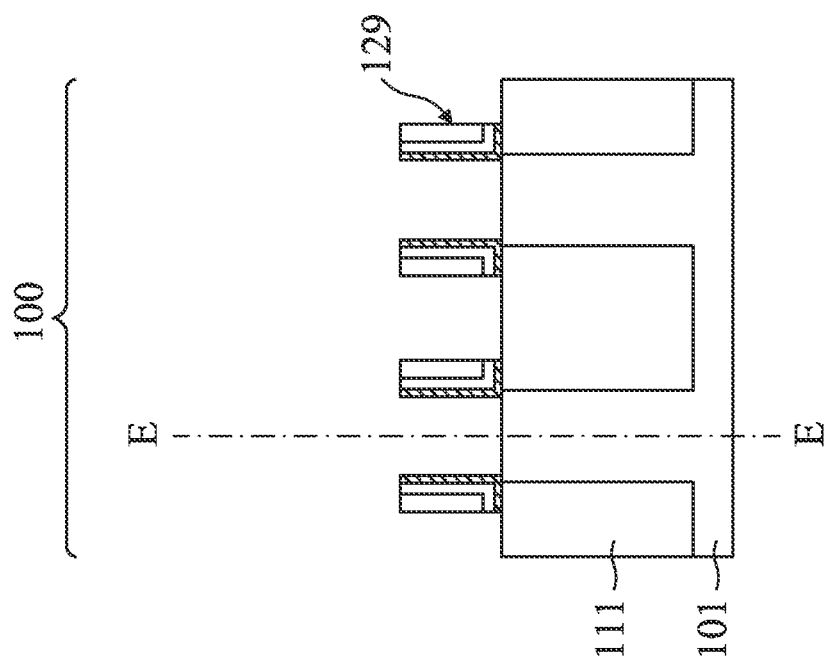
Figure 9G:
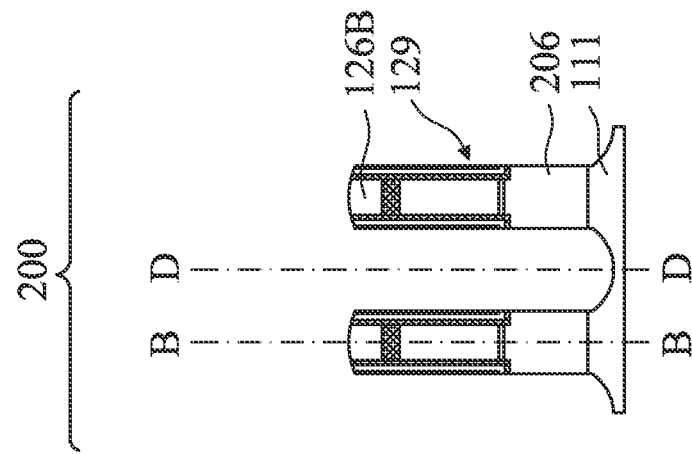
Figure 9F:
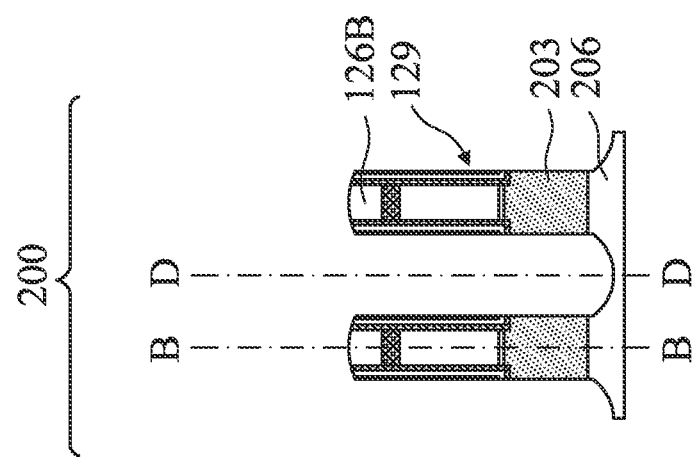
Figure 9E:
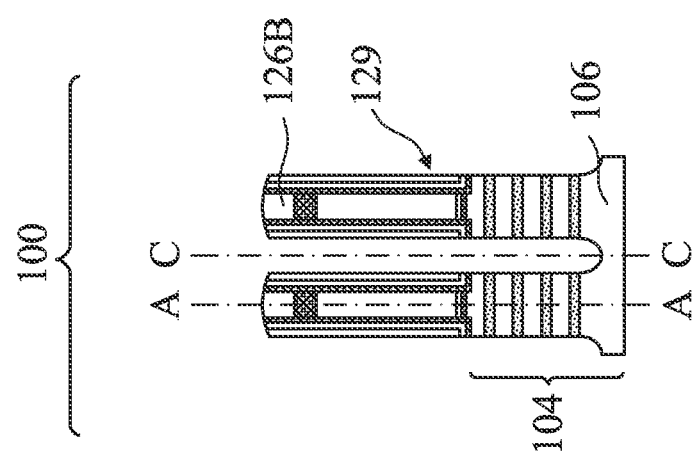
Figure 10B:
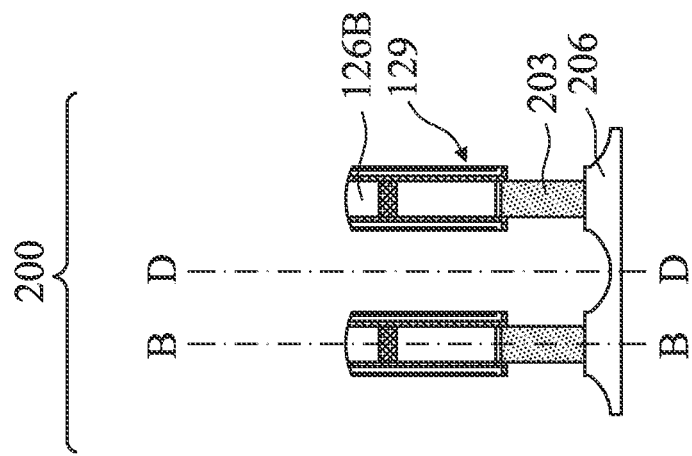
Figure 10A:
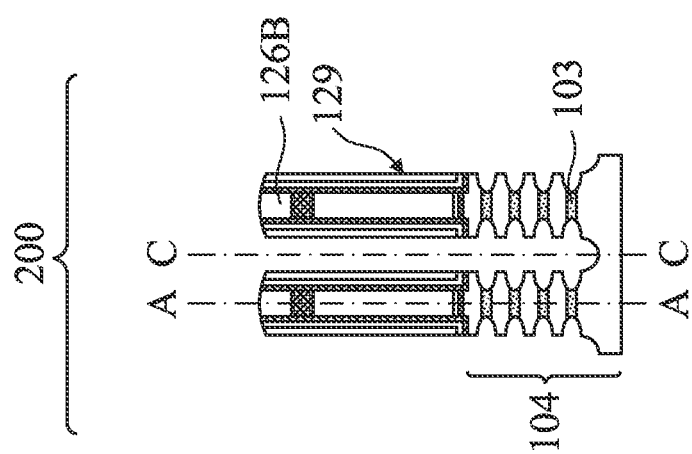
Figure 11B:
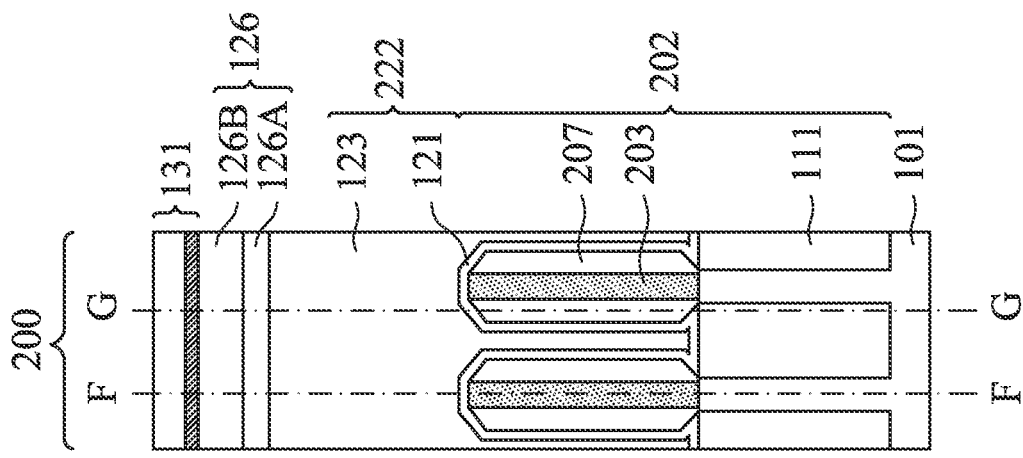
Figure 11A:
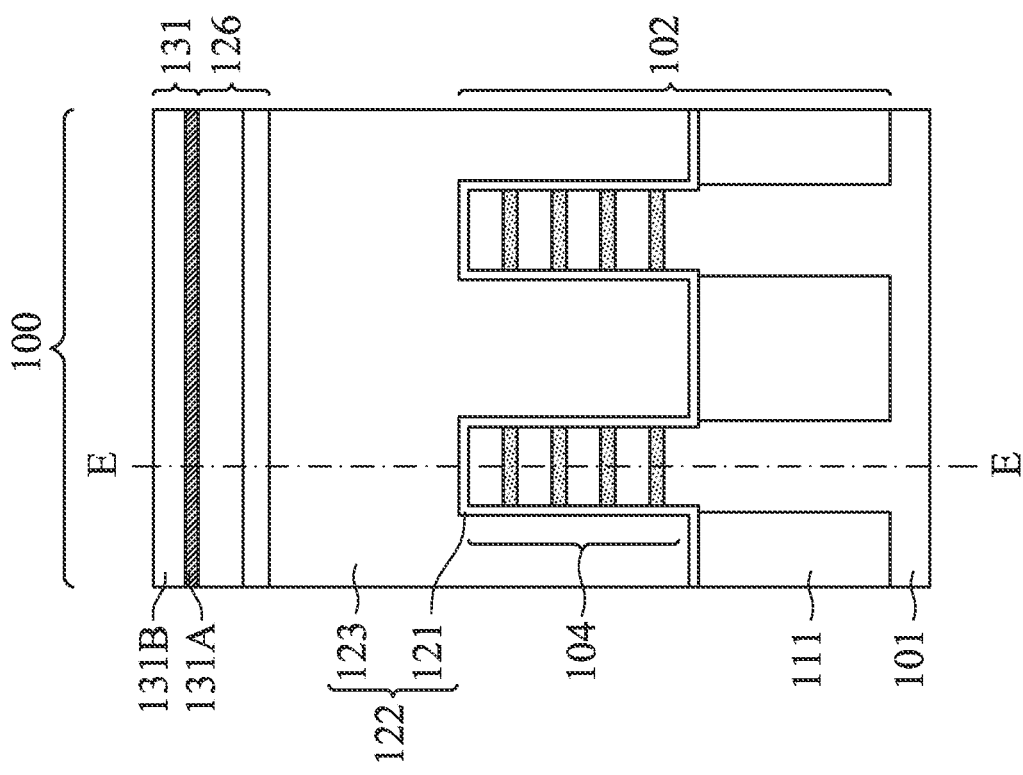
Figure 11D:
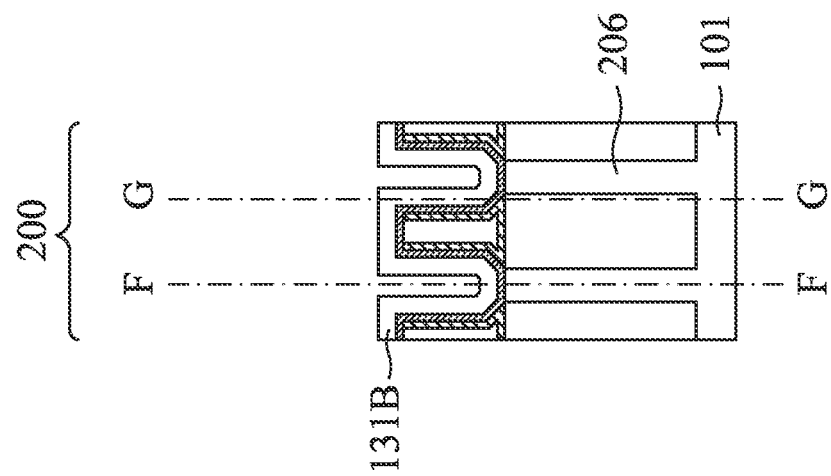
Figure 11C:
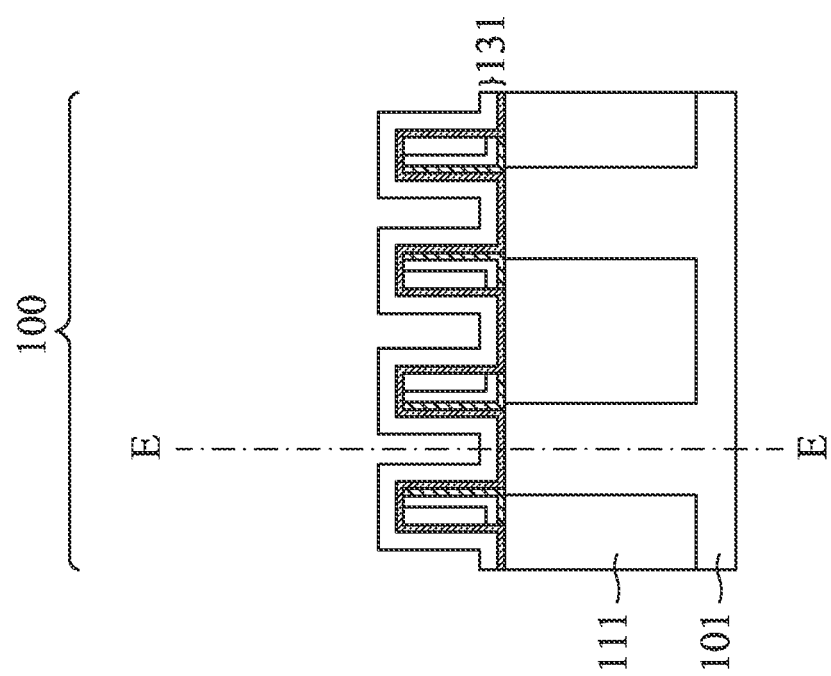
Figure 12B:
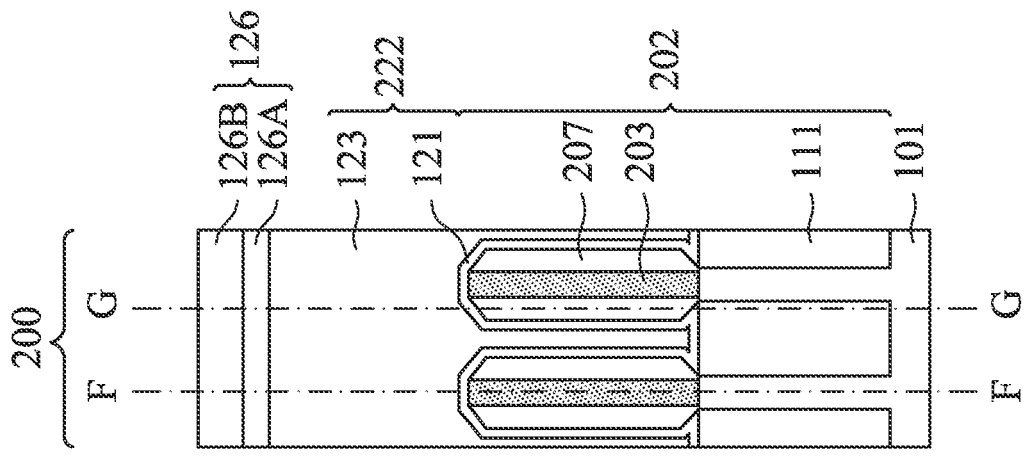
Figure 12A:
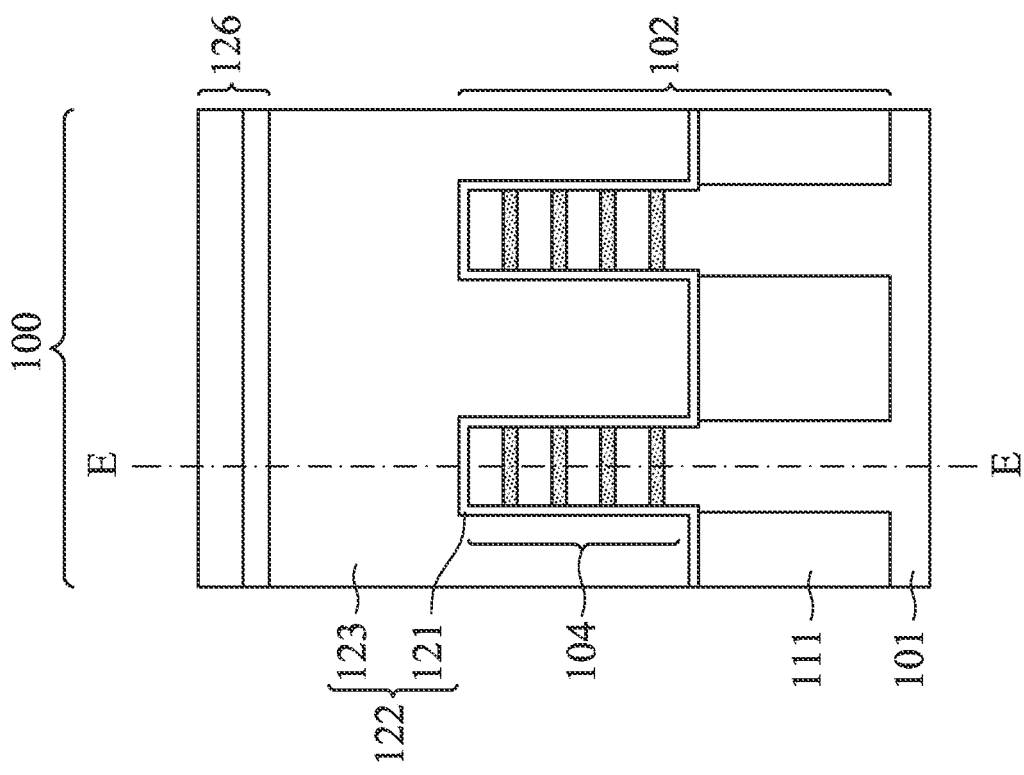
Figure 12D:
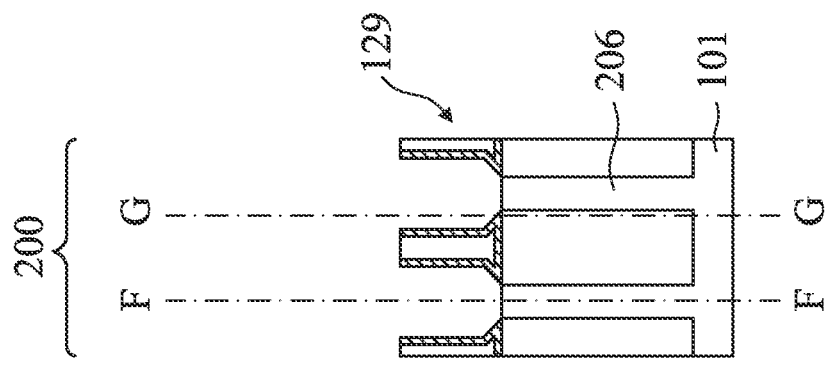
Figure 12C:
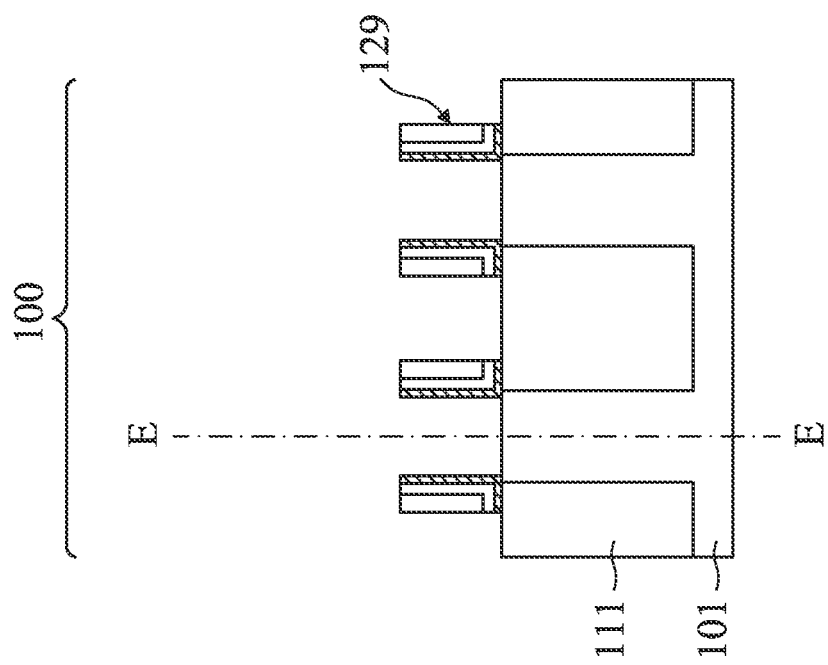
Figure 13B:
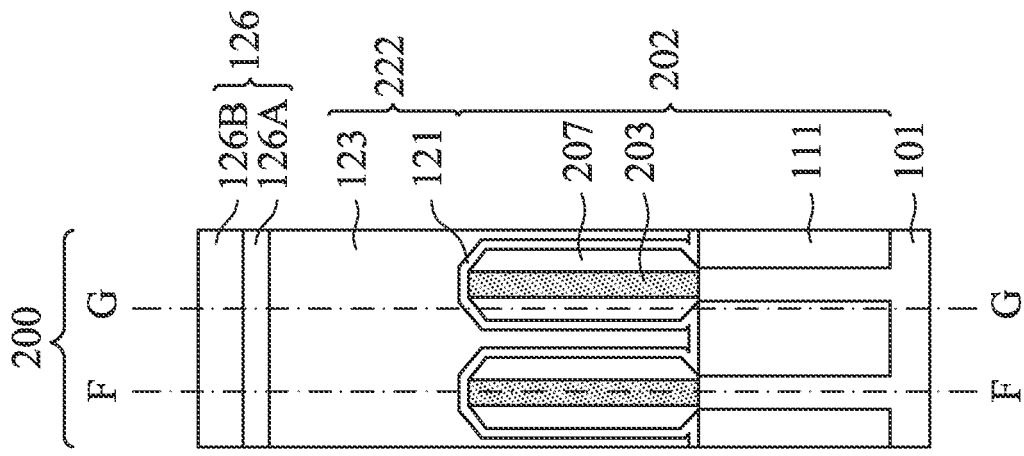
Figure 13A:
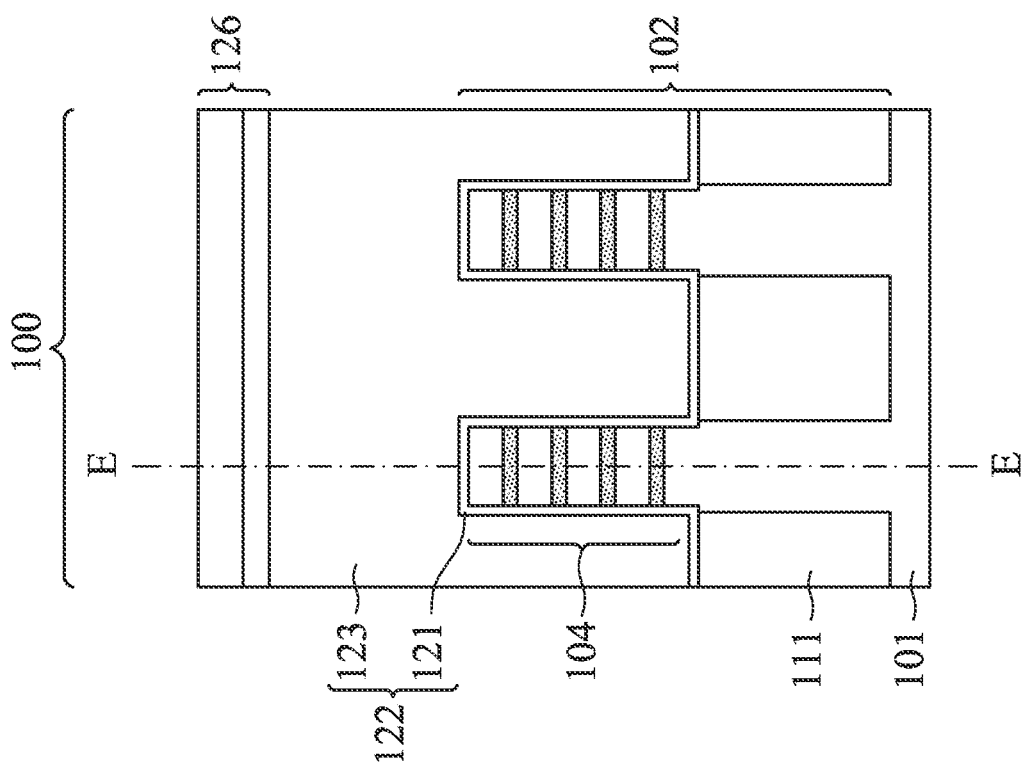
Figure 13D:
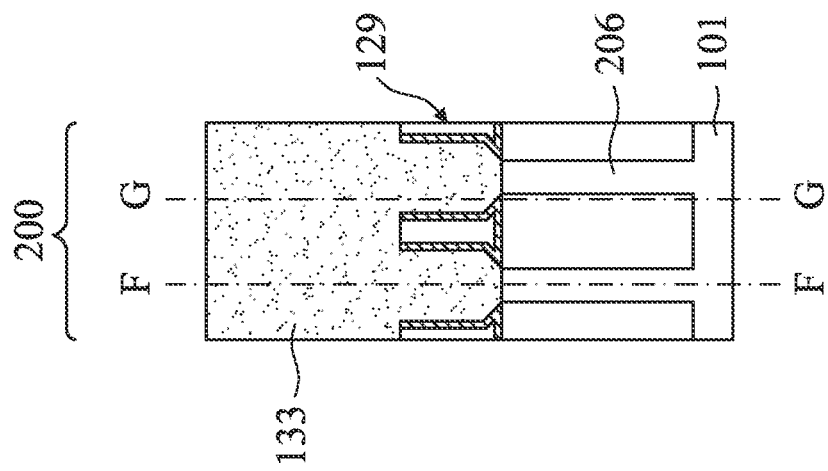
Figure 13C:
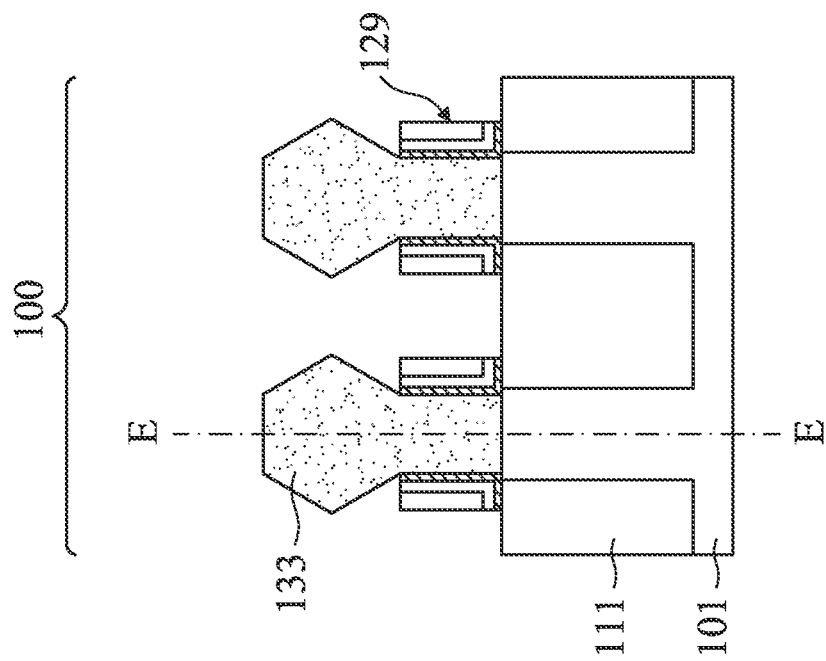
Figures 13E, 13F, 13G:
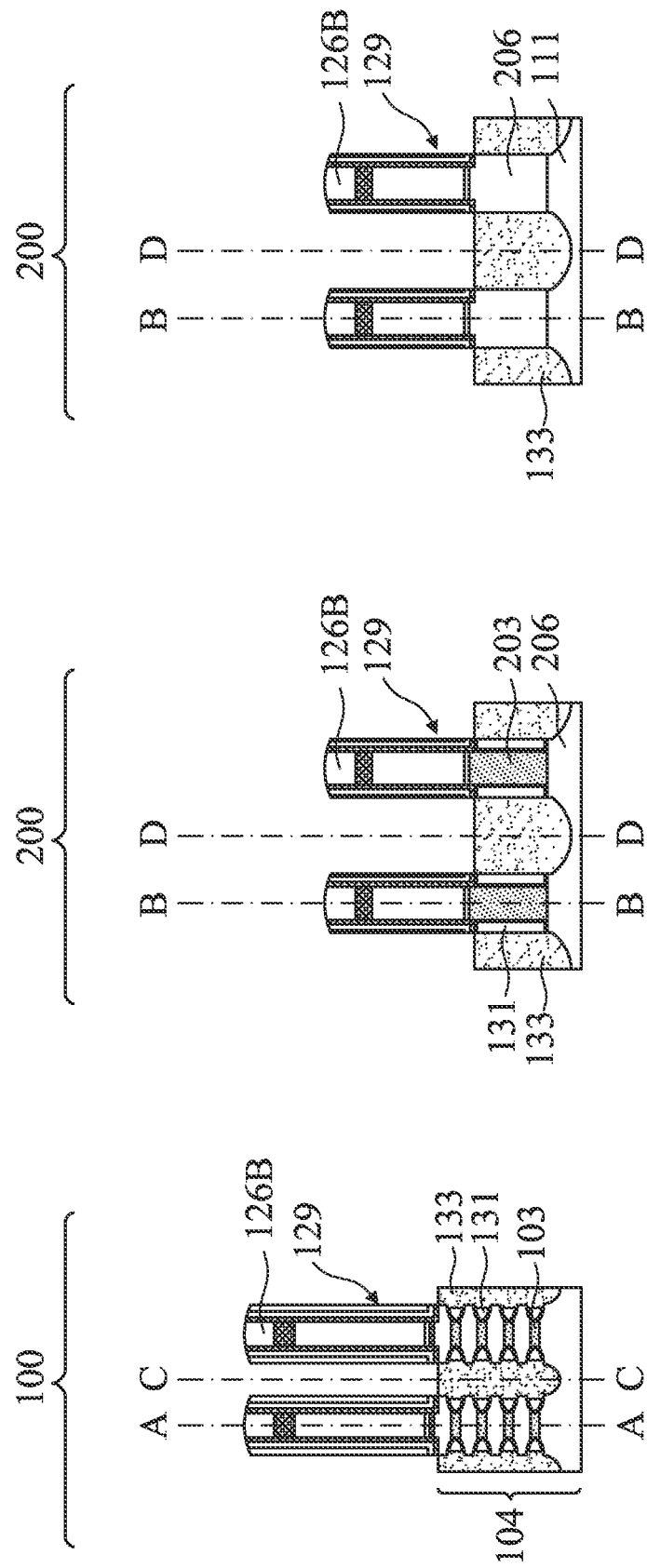

Next, in FIGS. 10A-B, a lateral etching process is performed to recess exposed portions of the first semiconductor layers 103 and the mandrel material 203. FIG. 10A shows the cross-sectional view of region 100 shown in FIG. 9E, and FIG. 10B shows the cross-sectional view of region 200 shown in FIG. 9F. In some embodiments, the lateral etching process may be an anisotropic etching process that is relatively selective to the first semiconductor material over other materials. The lateral etching process, being selective to first semiconductor layers 103 and the mandrel material 203, recesses the first semiconductor layers 103 and the mandrel material 203 from the second semiconductor layers 105 and the semiconductor strips 106/206. For example, the lateral etching process may include an etchant selective to silicon germanium over silicon, such as a dry process comprising HF, $F_2$ or the like, or such as a wet process comprising $O_3$, $NH_4OH$, or the like.

Next, in FIG. 11A-G, a dielectric material 131 is formed to fill the space left by the recessing of the first semiconductor layers 103 and the mandrel material 203. The cross-sectional views shown in FIGS. 11A-G are the same as the respective cross-sectional views shown in FIGS. 8A-G. The dielectric material 131 may be a low-K dielectric material, such as silicon oxide, silicon nitride, silicon carbonitride, silicon oxycarbonitride, or the like, and may be formed by a suitable deposition method, such as CVD, ALD, or the like. The dielectric material 131 may include multiple layers or may be a single layer. For example, the dielectric material 131 may include a first layer 131A comprising a metal oxide or a low-K dielectric material as described above and a second layer 131B comprising a different low-K dielectric material than the first layer 131A. The dielectric material may have a thickness between about 4 nm and about 7 nm, in some embodiments. In some embodiments, the dielectric material 131 comprises a single layer of a low-K dielectric material as described above.

Referring to FIGS. 12A-G, after the deposition of the dielectric material 131, an anisotropic etching process may be performed to trim the dielectric material 131. The cross-sectional views shown in FIGS. 12A-G are the same as the respective cross-sectional views shown in FIGS. 8A-G. The etching process removes the deposited dielectric material 131 such that portions of the deposited dielectric material 131 are left remaining within the recesses formed by the removal of the first semiconductor layers 103 and the mandrel material 203. After the etching process, the remaining portions of the deposited dielectric material 131 form inner spacers 131, as shown in FIGS. 12A-G. The inner spacers 131 serve to isolate metal gates from source/drain regions formed in subsequent processing.

Next, in FIGS. 13A-G, source/drain regions 133 are formed over the semiconductor strips 106 in the region 100 and the region 200. The cross-sectional views shown in FIGS. 13A-G are the same as the respective cross-sectional views shown in FIGS. 8A-G. In some embodiments, subregions of the region 100 and subregions of the region 200 may be designated for n-type devices or p-type devices, and the source/drain regions 133 of the n-type devices may be formed in separate steps than the source/drain regions 133 of the p-type devices. The source/drain regions 133 of region 100 may be formed in separate steps than the source/drain regions 133 of region 200. The source/drain regions 133 are formed by epitaxially growing a material over the semiconductor strips 106, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof. The epitaxial source/drain regions 133 may have raised surfaces and may have facets. In some cases, the process described herein can reduce unwanted merging of adjacent source/drain regions 133. The material(s) of the source/drain regions 133 may be tuned in accordance with the type of devices to be formed. In some embodiments, the resulting device is an n-type device, and source/drain regions 133 comprise silicon carbide (SiC), silicon phosphorous (SiP), phosphorous-doped silicon carbon (SiCP), or the like. In some embodiments, the resulting device is a p-type device, and source/drain regions 133 comprise SiGe, and a p-type impurity such as boron or indium.

The epitaxial source/drain regions 133 may be implanted with dopants followed by an anneal process. The implanting process may include forming and patterning masks such as a photoresist to cover subregions of the regions 100/200 that are to be protected from the implanting process. The source/drain regions 133 may have an impurity (e.g., dopant) concentration in a range from about 1E19 $cm^{-3}$ to about 1E21 $cm^{-3}$. P-type impurities, such as boron or indium, may be implanted in the source/drain region 133 of a p-type transistor. N-type impurities, such as phosphorous or arsenide, may be implanted in the source/drain regions 133 of an n-type transistor. In some embodiments, the epitaxial source/drain regions may be in situ doped during growth.

Figure 14E:
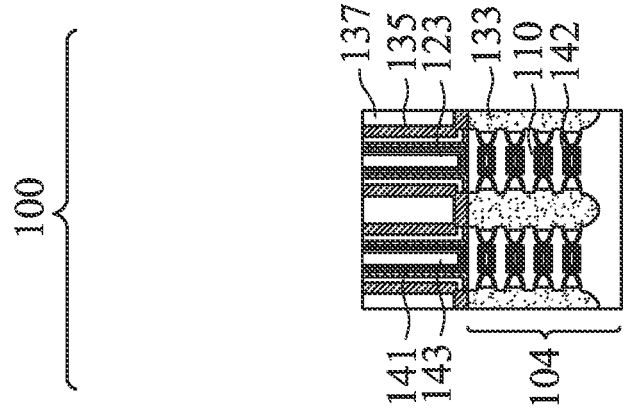

FIGS. 14A-E illustrate cross-sectional views of the region 100 at various stages of processing to form replacement gate electrodes 143, in accordance with some embodiments. The cross-sectional view shown in FIGS. 14A-E is the same as that of FIG. 13E. In FIG. 14A, a contact etch stop layer (CESL) 135 is formed over the structure illustrated in FIG. 13A, and an interlayer dielectric (ILD) layer 137 is formed over the CESL 135. The CESL 135 functions as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like. The ILD layer 137 is formed over the CESL 135 and around the dummy gate structures 122. In some embodiments, the ILD layer 137 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD.

In FIG. 14B, a planarization process, such as a CMP process, may be performed to remove portions of the CESL 135 disposed over the gate electrode 123. As illustrated in FIG. 14B, after the planarization process, the top surface of the ILD layer 137 is level with the top surface of the gate electrode 123. Next, in FIG. 14C, the gate electrode 123 and the gate dielectric 121 of the dummy gate structure are removed in one or more etching steps, so that recesses 128 are formed between the gate spacers 129.

Figure 14D:
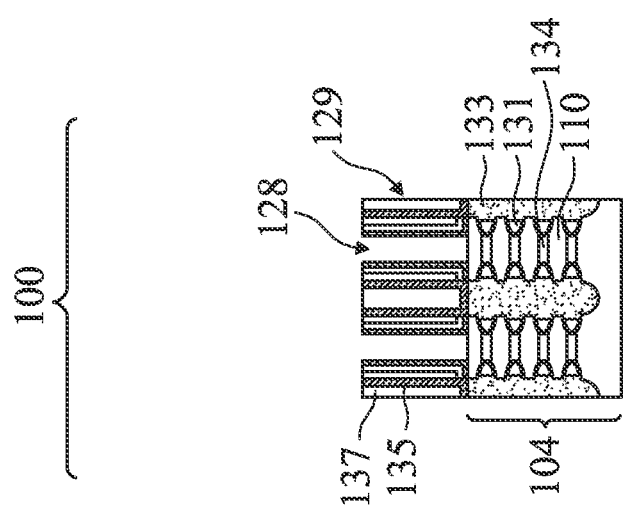

In FIG. 14D, the first semiconductor layers 103 are removed to release the second semiconductor layer 105, such that the center portions (e.g., portions between inner spacers 131 and under the recess 128) of the second semiconductor layers 105 are suspended. After the first semiconductor layers 103 are removed, the second semiconductor layer 105 forms a plurality of nanostructures 110. In other words, the second semiconductor layer 105 may also be referred to as nanostructures 110 in subsequent processing. The first semiconductor layers 103 may be removed by a selective etching process such as a dry etch or a wet etch that is selective to the first semiconductor material (e.g., silicon germanium) over the second semiconductor material (e.g., silicon). For example, a wet etch that is selective to silicon germanium such as $NH_4OH:H_2O_2:H_2O$ (ammonia peroxide mixture, APM), $H_2SO_4+H_2O_2$ (sulfuric acid peroxide mixture, SPM), or the like, may be used. Other suitable processes and/or materials may be used. Note that the center portions of the nanostructures 110 are suspected, with empty spaces 134 between adjacent nanostructures 110. Other portions of the nanostructures 110 are not released by the selective etching process described above, such as portions under the gate spacers 129 and portions beyond the boundaries of the gate spacers 129 (which may be referred to as end portions). Instead, these portions of the nanostructures 110 may be surrounded by the inner spacers 131.

Referring next to FIG. 14E, an interface layer 142 is formed over the surfaces of the nanostructures 110. The interface layer 142 is a dielectric layer, such as an oxide, and may be formed by a thermal oxidization process or a deposition process. In some embodiments, a thermal oxidization process is performed to convert exterior portions of the nanostructures 110 into an oxide to form the interface layer 142.

After the interface layer 142 is formed, a gate dielectric layer 141 is formed around the nanostructures 110. The gate dielectric layer 141 is also formed on the upper surface of the STI regions 111. In some embodiments, the gate dielectric layer 141 includes a high-k dielectric material (e.g., having a K value greater than about 7.0), and may include a metal oxide or a silicate of Hf, Al, Zr, La, Mg, Ba, Ti, Pb, or combinations thereof. For example, the gate dielectric layers 141 may comprise $HfO_2$, $ZrO_2$, HfAlOx, $HfSiO_x$, $Al_2O_3$, or combinations thereof. The formation methods of the gate dielectric layer 141 may include molecular beam deposition (MBD), ALD, CVD, PECVD, and the like.

An electrical conductive material (may also be referred to as a fill metal) is then formed in the recess 128 to form gate electrode 143. The gate electrode 143 may be made of a metal-containing material such as Cu, Al, W, Ru, the like, combinations thereof, or multi-layers thereof, and may be formed by, e.g., electroplating, electroless plating, CVD, PVD, or other suitable method. After the gate electrode 143 is formed, a planarization process such as CMP may be performed to planarize the upper surface of the gate electrode 143. The gate electrode 143 at least partially encircles the nanostructures 110 to form a GAA FET device in region 100.

Although not illustrated, barrier layers and work function layers may be formed over the gate dielectric layer 141 and around the nanostructures 110 before the electrical conductive material is formed. The barrier layer may comprise an electrically conductive material such as titanium nitride, although other materials, such as tantalum nitride, titanium, tantalum, or the like, may alternatively be utilized. The barrier layer may be formed using a CVD process, such as PECVD. However, other alternative processes, such as sputtering, metal organic chemical vapor deposition (MOCVD), or ALD, may alternatively be used. After the barrier layer is formed, one or more work function layers (not shown) may be formed over the barrier layer, in some embodiments. In some embodiments, an n-type work function layer may be formed over the barrier layer and around the nanostructures 110 for an n-type device, and a p-type work function layer may be formed over the barrier layer and around the nanostructures 110 for a p-type device. Exemplary n-type work function metals that may be included in the gate structures for n-type devices include Ti, Ag, TaAl, TaAlC, TiAlN, TaC, TaCN, TaSiN, Mn, Zr, other suitable n-type work function materials, or combinations thereof. Exemplary p-type work function metals that may be included in the gate structures for p-type devices include TiN, TaN, Ru, Mo, Al, WN, $ZrSi_2$, $MoSi_2$, $TaSi_2$, $NiSi_2$, WN, other suitable p-type work function materials, or combinations thereof. The work function layer(s) may be deposited using CVD, PVD, ALD, and/or another suitable process.

Figures 15A, 15B, 15C, 15D:
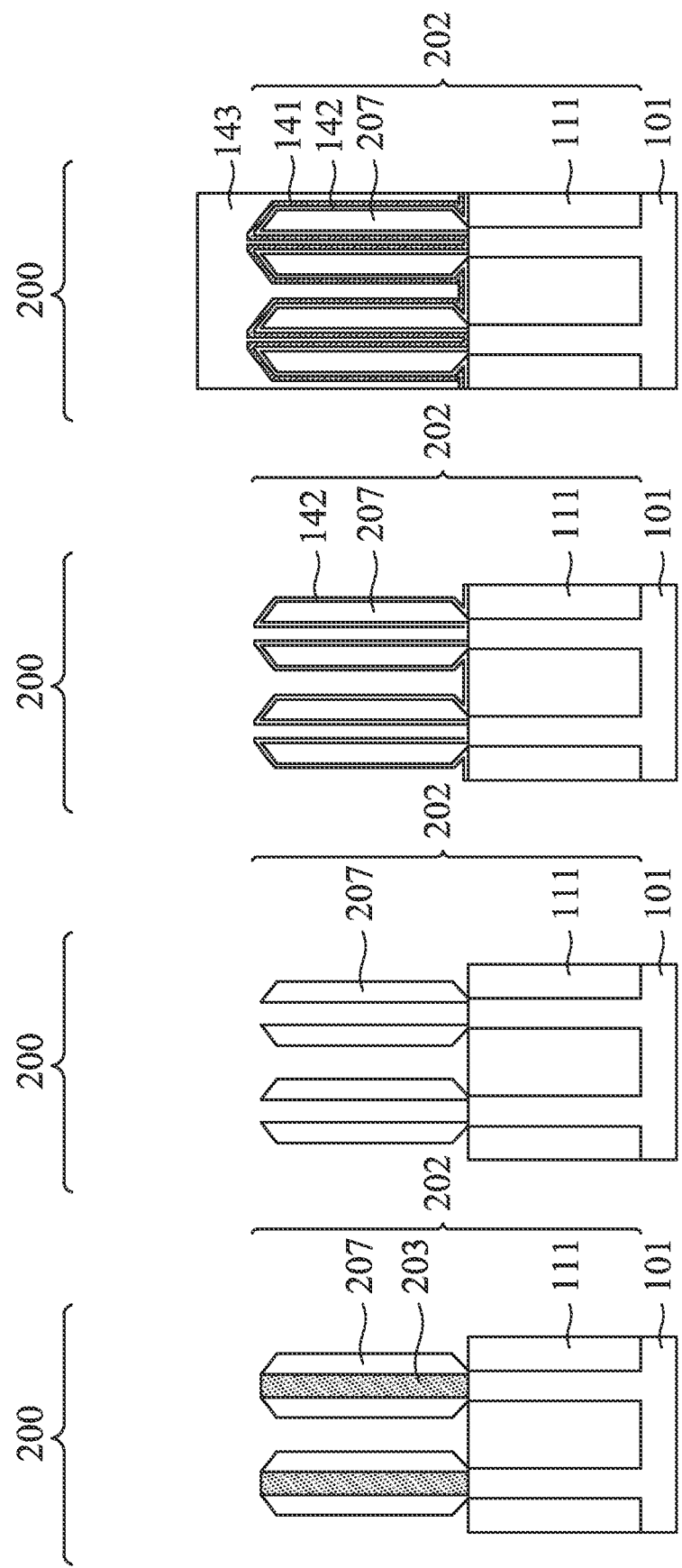
FIGS. 15A through 15D illustrate cross-sectional views of intermediate stages in the formation of double-channel FinFETs in a hybrid channel device, in accordance with some embodiments.

FIGS. 15A-D illustrate cross-sectional views of the region 200 at various stages of processing to form replacement gate electrodes 143, in accordance with some embodiments. The cross-sectional view shown in FIGS. 15A-D is the same as that of FIG. 13B. Some or all of the processing steps in FIGS. 15A-D may be performed in the same steps as analogous steps shown in FIGS. 14A-E. In FIG. 15A, the gate electrode 123 and the gate dielectric 121 of the dummy gate structure 222 are removed in one or more etching steps.

In FIG. 15B, the mandrels 203 are removed to release the channel regions 207, such that the each channel region 207 is separated. In this manner, two channel regions 207 may be formed over each semiconductor strip 206. The mandrels 203 may be removed by a selective etching process such as a dry etch or a wet etch that is selective to the mandrel material 203 (e.g., silicon germanium) over the second semiconductor material (e.g., silicon). The selective etching process may be similar to previously described selective etching processes. Referring next to FIG. 15C, an interface layer 142 is formed over the surfaces of the channel regions 207. The interface layer 142 is a dielectric layer, such as an oxide, and may be formed by a thermal oxidization process or a deposition process. In some embodiments, a thermal oxidization process is performed to convert exterior portions of the channel region 207 into an oxide to form the interface layer 142.

After the interface layer 142 is formed, a gate dielectric layer 141 is formed around the channel region 207. The gate dielectric layer 141 is also formed on the upper surface of the STI regions 111. In some embodiments, the gate dielectric layer 141 includes a high-k dielectric material (e.g., having a K value greater than about 7.0), and may include materials similar to those described previously for FIG. 14E. The gate dielectric layer 141 may be formed using processes described previously. An electrical conductive material is then formed over the channel regions 207 to form gate electrode 143. The gate electrode 143 may be made of a metal-containing material such as described previously, and may be formed using processes described previously. After the gate electrode 143 is formed, a planarization process such as CMP may be performed to planarize the upper surface of the gate electrode 143. In this manner, a double-channel FinFET device may be formed in region 200.

Although not illustrated, barrier layers and work function layers may be formed over the gate dielectric layer 141 and around the channel regions 207 before the electrical conductive material is formed. The barrier layer may be similar to those described previously, and may be formed in a similar manner. After the barrier layer is formed, the work function layers (not shown) may be formed over the barrier layer, in some embodiments. The work function layers may be similar to those described previously, and may be formed in a similar manner.

Embodiments may achieve advantages. Processes described herein allow for the formation of both nanostructure FETs and FinFETs on the same substrate. As such, the processes described herein allow for the formation of a "hybrid channel" FET device. The use of silicon germanium to form mandrels allows two channel regions to be epitaxially grown for each FinFET. In this manner, FinFET devices may be formed having twice as many channel regions. By having twice as many channels, the current capacity of a FinFET device may be increased. Additionally, the use of silicon germanium improves process uniformity and reduces the chance of defects during formation.

In accordance with an embodiment, a semiconductor device includes semiconductor strips protruding from a substrate, wherein the semiconductor strips includes first semiconductor strips in a first region of the substrate and second semiconductor strips in a second region of the substrate, nanostructures over and aligned with the first semiconductor strips of the first region, first source/drain regions at opposing ends of the nanostructures, a first gate structure partially encircling the nanostructures, double channel regions over the second semiconductor strips of the second region, wherein each double channel region includes a first channel region aligned with a first side of one semiconductor strip and a second channel region aligned with a second side of the one semiconductor strip, wherein the first channel region is separated from the second channel region, second source/drain regions at opposing ends of the double channel regions, and a second gate structure over the double channel regions, wherein the second gate structure separates each first channel region of a double channel region from the corresponding second channel region of the double channel region. In an embodiment, the nanostructures include semiconductor nanowires. In an embodiment, the first channel region of each double channel region is separated from the corresponding second channel region of the double channel region by a distance in the range of 5 nm and 10 nm. In an embodiment, facing sidewalls of the first channel region and the corresponding second channel region of the double channel region are flat. In an embodiment, the second gate structure contacts top surfaces of the second semiconductor strips between each first channel region and the corresponding second channel region of the double channel region. In an embodiment, the double channel regions are silicon. In an embodiment, the first channel regions and the second channel regions have a width that is in the range of 5 nm and 10 nm. In an embodiment, the first region of the substrate is adjacent the second region of the substrate.

In accordance with an embodiment, a device includes a first semiconductor strip protruding from a substrate, a second semiconductor strip protruding from the substrate, an isolation material surrounding the first semiconductor strip and the second semiconductor strip, a nanosheet structure over the first semiconductor strip, wherein the nanosheet structure is separated from the first semiconductor strip by a first gate structure including a gate electrode material, wherein the first gate structure partially surrounds the nanosheet structure, and a first semiconductor channel region and a semiconductor second channel region over the second semiconductor strip, wherein the first semiconductor channel region is separated from the second semiconductor channel region by a second gate structure including the gate electrode material, wherein the second gate structure extends on a top surface of the second semiconductor strip. In an embodiment, the first semiconductor channel region and the second semiconductor channel region vertically extend from the second semiconductor strip a distance between 40 nm and 70 nm. In an embodiment, the first semiconductor channel region and the semiconductor second channel region include semiconductor silicon. In an embodiment, a first portion of the first semiconductor channel is closer to the isolation material than a second portion of the first semiconductor channel, wherein the first portion has a smaller width than the second portion. In an embodiment, the first channel region extends over the isolation material. In an embodiment, a distance between the away-facing surfaces of the first semiconductor channel region and the semiconductor second channel region is greater than a width of the second semiconductor strip. In an embodiment, the second gate structure extends on away-facing surfaces of the first semiconductor channel region and the semiconductor second channel region.

In accordance with an embodiment, a method of forming a semiconductor device includes forming an epitaxial structure over a semiconductor substrate, wherein the epitaxial structure includes alternating layers of silicon and silicon germanium, recessing a portion of the epitaxial structure to form a trench, filling the trench with silicon germanium, patterning the silicon germanium in the trench to form mandrels, epitaxially growing silicon on the sidewalls of the mandrels to form channel regions, removing the mandrels, and forming a gate structure over the channel regions, the gate structure extending between the channel regions. In an embodiment, the mandrels are removed using an etching process that selectively etches silicon germanium over silicon. In an embodiment, filling the trench with silicon germanium fully fills the trench with silicon germanium. In an embodiment, the method further includes forming nanostructures, including patterning the epitaxial structure to form a fin, removing the layers of silicon germanium of the fin, and forming a gate electrode around the remaining silicon layers of the fin. In an embodiment, the channel regions are separated by a distance between 5 nm and 10 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    forming an epitaxial structure over a semiconductor substrate, wherein the epitaxial structure comprises alternating layers of a first semiconductor material and a second semiconductor material;
    recessing a portion of the epitaxial structure to form a trench;
    filling the trench with the second semiconductor material;
    patterning the second semiconductor material in the trench to form mandrels;
    epitaxially growing a third semiconductor material on the sidewalls of the mandrels to form channel regions;
    removing the mandrels; and
    forming a gate structure over the channel regions, the gate structure extending between the channel regions.

2. The method of claim 1, wherein the first semiconductor material is silicon.

3. The method of claim 1, wherein the second semiconductor material is silicon germanium.

4. The method of claim 1, wherein the third semiconductor material is silicon.

5. The method of claim 1, wherein the mandrels are removed using an etching process that selectively etches the second semiconductor material more than the first semiconductor material.

6. The method of claim 1 further comprising patterning the semiconductor substrate to form semiconductor fins, wherein each mandrel is on a respective semiconductor fin.

7. The method of claim 1, wherein filling the trench with the second semiconductor material fully fills the trench with the second semiconductor material.

8. The method of claim 1, further comprising forming nanostructures, comprising:
    patterning the epitaxial structure to form a fin;
    removing the second semiconductor material layers of the fin; and
    forming a gate electrode around the remaining first semiconductor material layers of the fin.

9. The method of claim 1, the channel regions are separated by a distance between 5 nm and 10 nm.

10. A method comprising:
    forming a first fin and a second fin on a semiconductor substrate;
    forming a nanostructure on the first fin;
    forming a mandrel on the second fin, wherein the mandrel comprises a first semiconductor material;
    forming a first layer of a second semiconductor material on a first side of the mandrel and a second layer of the second semiconductor material on a second side of the mandrel;
    removing the mandrel using an etching process;
    forming a first gate dielectric layer on the nanostructure;
    forming a second gate dielectric layer on the first layer of the second semiconductor material and on the second layer of the second semiconductor material; and
    forming a gate electrode material over the first gate dielectric layer and over the second gate dielectric layer.

11. The method of claim 10, wherein the first semiconductor material is silicon germanium and the second semiconductor material is silicon.

12. The method of claim 10, wherein forming the first layer of the second semiconductor material and the second layer of the second semiconductor material comprises an epitaxial growth process.

13. The method of claim 10, wherein the second gate dielectric layer extends between the first layer of the second semiconductor material and the second layer of the second semiconductor material.

14. The method of claim 10 further comprising forming a source/drain region on the second fin, wherein the source/drain region physically contacts the first layer of the second semiconductor material and the second layer of the second semiconductor material.

15. The method of claim 10, wherein removing the mandrel exposes a top surface of the second fin.

16. The method of claim 10, wherein the first layer of the second semiconductor material and the second layer of the second semiconductor material are formed before the nanostructure is formed.

17. A method comprising:
    forming an epitaxial stack over a substrate, comprising depositing alternating layers of silicon and silicon germanium;
    removing a portion of the epitaxial stack to expose a portion of the substrate;
    depositing a layer of silicon germanium on the exposed portion of the substrate;
    patterning the layer of silicon germanium and the substrate to form strips of silicon germanium on first strips of the substrate;
    patterning the epitaxial stack and the substrate to form strips of the epitaxial stack on second strips of the substrate;
    epitaxially depositing silicon on sidewalls of the strips of silicon germanium to form channel regions;
    removing the strips of silicon germanium, wherein the channel regions remain on the first strips of the substrate; and
    forming a first gate structure on the channel regions.

18. The method of claim 17, wherein the first gate structure extends between the channel regions on each first strip of the substrate.

19. The method of claim 17 further comprising etching the layers of silicon germanium in the strips of the epitaxial stack to form a plurality of nanostructures.

20. The method of claim 19 further comprising forming a second gate structure on the nanostructures.

* * * * *

UNITED STATES PATENT AND TRADEMARK OFFICE
CERTIFICATE OF CORRECTION

| | |
|---|---|
| PATENT NO. | : 11,742,387 B2 |
| APPLICATION NO. | : 17/745655 |
| DATED | : August 29, 2023 |
| INVENTOR(S) | : Wang et al. |

It is certified that error appears in the above-identified patent and that said Letters Patent is hereby corrected as shown below:

In the Claims

In Column 15, in Claim 9, Line 52, after "claim 1," insert -- wherein --.

Signed and Sealed this
Fourteenth Day of November, 2023

Katherine Kelly Vidal
*Director of the United States Patent and Trademark Office*